US012684908B2

(12) United States Patent
Huo

(10) Patent No.: US 12,684,908 B2
(45) Date of Patent: Jul. 14, 2026

(54) DISPLAY PANEL AND DISPLAY DEVICE

(71) Applicant: Tianma Advanced Display Technology Institute (Xiamen) Co., Ltd., Xiamen (CN)

(72) Inventor: Sitao Huo, Xiamen (CN)

(73) Assignee: Tianma Advanced Display Technology Institute (Xiamen) Co., Ltd, Xiamen (CN)

( * ) Notice: Subject to any disclaimer, the term of this patent is extended or adjusted under 35 U.S.C. 154(b) by 464 days.

(21) Appl. No.: 18/378,769

(22) Filed: Oct. 11, 2023

(65) Prior Publication Data

US 2024/0047613 A1 Feb. 8, 2024

(30) Foreign Application Priority Data

Jun. 30, 2023 (CN) .......................... 202310798559.2

(51) Int. Cl.
| | |
|---|---|
| *H10H 20/821* | (2025.01) |
| *H10H 20/812* | (2025.01) |
| *H10H 20/831* | (2025.01) |
| *H10H 20/857* | (2025.01) |
| *H10H 29/14* | (2025.01) |
| *H10W 90/00* | (2026.01) |
| *H10H 20/814* | (2025.01) |

(52) U.S. Cl.
CPC ........ *H10H 20/821* (2025.01); *H10H 20/812* (2025.01); *H10H 20/8314* (2025.01); *H10H 20/857* (2025.01); *H10H 29/142* (2025.01); *H10W 90/00* (2026.01); *H10H 20/814* (2025.01)

(58) Field of Classification Search
CPC ............. H10H 20/812; H10H 20/8314; H10H 20/814; H10H 20/8506; H10H 20/855; H10H 20/819
See application file for complete search history.

(56) References Cited

U.S. PATENT DOCUMENTS

2021/0399056 A1* 12/2021 Wang ................... H10K 50/865

FOREIGN PATENT DOCUMENTS

CN 108281456 A 7/2018

* cited by examiner

*Primary Examiner* — Fernando L Toledo
*Assistant Examiner* — Adam S Bowen
(74) *Attorney, Agent, or Firm* — KDW Firm PLLC

(57) ABSTRACT

Provided are a display panel and a display device, belonging to the field of display technology. The display panel includes a substrate and a light emission device layer. The light emission device layer is located on a side of the substrate. The light emission device layer includes multiple light-emitting structures. A light-emitting structure includes a first electrode and a second electrode. In the direction perpendicular to the plane where the substrate is located, the first electrode and the second electrode are located on the side of the light-emitting structure facing the substrate. The surface on the side of the light-emitting structure facing away from the substrate includes a recess portion. At least part of the surface on the side of the light-emitting structure facing away from the substrate recesses toward a side adjacent to the substrate, so that a recess portion is formed.

20 Claims, 15 Drawing Sheets

DISPLAY PANEL AND DISPLAY DEVICE

CROSS-REFERENCE TO RELATED APPLICATION(S)

This application claims priority to Chinese Patent Application No. 202310798559.2 filed on Jun. 30, 2023, the disclosure of which is incorporated herein by reference in its entirety.

TECHNICAL FIELD

The present invention relates to the field of display technology and, in particular, to a display panel and a display device.

BACKGROUND

With the continuous development of light-emitting diode (LED) technology, the size of an LED gradually decreases. A micron-sized LED has a great application prospect due to good stability and service life, and the advantage in an operating temperature, and also inherits the advantages of a light-emitting diode such as low power consumption and color saturation, a fast reaction speed, and strong contrast. The micron-sized LED has a great application prospect, has become a research hotspot in the field of display at present, and can be applied to fields such as a display screen, backlight, automotive lighting, and a wearable device. A micro light-emitting diode (microLED) display and a mini light-emitting diode (mini LED) display that integrate high-density micro-sized LED arrays on a substrate and use the arrays as display pixels to implement image display. Like a large-sized outdoor LED display screen, each pixel may be addressed and individually driven to light, which may be regarded as a scaled-down version of the outdoor LED display screen. A pixel distance is reduced from a millimeter size to a micron size. The two types of displays are self-light-emitting displays, have advantages such as better material stability, longer service life, and no image imprint, and are considered to be ideal display technology in the future.

At present, the surface of a micro/mini LED chip is a flat structure, and the light-type distribution includes side viewing angle light and vertical viewing angle light. Due to the inherent light type and structure of the micro/mini LED chip, an apparent halo effect occurs in practical application. The brightest viewing angle of a micro/mini LED in a flat structure is not a positive viewing angle, and the light intensity of the side viewing angle in the light-type distribution is stronger than the light intensity of the vertical viewing angle. The component of light emitted in a side direction is large. The light emitted in a side direction is reflected by the interface of each film of a display to form transverse light waveguide. As a result, an apparent halo phenomenon during display is easily caused. Once the proportion of side light is greater, the probability of total reflection may be higher, and the halo phenomenon may be more apparent, which greatly affects the display quality and effect.

In the related art, a box dam or a blocking structure is used to limit the light-emitting range of a light-emitting chip in a plane parallel to the carrier surface of the chip, so that the light-emitting range of the light-emitting chip is prevented from covering a region in which an adjacent light-emitting chip is located, and a halo phenomenon is avoided. However, this solution may increase the process and process difficulty and increase the manufacturing costs, and the structure is complicated.

Therefore, it is an urgent technical problem to be solved for those skilled in the art to provide a display panel and a display device that are not only simple in structure, but also can reduce the halo phenomenon during display, and improve the display quality and display effect.

SUMMARY

In view of the above, the present invention provides a display panel and a display device.

The present invention provides a display panel. The display panel includes a substrate and a light emission device layer. The light emission device layer is located on a side of the substrate. The light emission device layer includes multiple light-emitting structures, a first electrode and a second electrode. In the direction perpendicular to the plane where the substrate is located, the first electrode and the second electrode are located on the side of the light-emitting structure facing the substrate. The surface on the side of the light-emitting structure facing away from the substrate includes a recess portion. The recess portion is formed by at least part of the surface on the side of the light-emitting structure facing away from the substrate, which recesses toward a side of the light-emitting structure adjacent to the substrate.

The present invention also provides a display device. The display device includes the preceding display panel.

BRIEF DESCRIPTION OF DRAWINGS

The drawings, which are incorporated in and constitute a part of the description, illustrate embodiments of the present invention and, together with the description, serve to explain the principles of the present invention.

DETAILED DESCRIPTION

Figure 1:
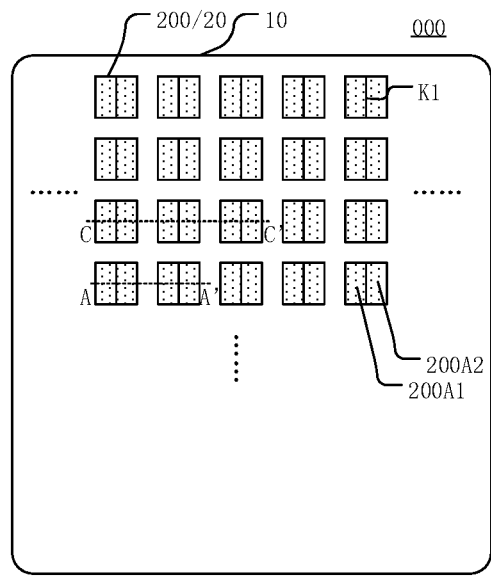
FIG. 1 is a diagram illustrating the planar structure of a display panel according to an embodiment of the present invention.

Various example embodiments of the present invention are described in detail with reference to the drawings. It should be noted that relative arrangements of components and steps, numerical expressions, and numerical values set forth in these embodiments do not limit the scope of the present invention unless otherwise specified.

The description below of at least one example embodiment is merely illustrative in nature and is in no way intended to limit the present invention and the present application or usages thereof.

Techniques, methods, and devices known to those of ordinary skill in the related art may not be discussed, but where appropriate, such techniques, methods, and devices should be considered part of the specification.

In all examples shown and discussed herein, any values should be construed as merely exemplary and not as limiting. Therefore, other examples of the example embodiments may have different values.

It is obvious for those skilled in the art that various modifications and changes in the present invention may be made without departing from the spirit or scope of the present invention. Accordingly, the present invention is intended to cover modifications and variations of the present invention that fall within the scope of the corresponding claims (the claimed technical solutions) and their equivalents. It is to be noted that embodiments of the present invention, if not in collision, may be combined with each other.

It should be noted that similar reference numerals and letters indicate similar items in the drawings below, and therefore, once a particular item is defined in a drawing, the item need not to be further discussed in drawings below.

Figure 2:
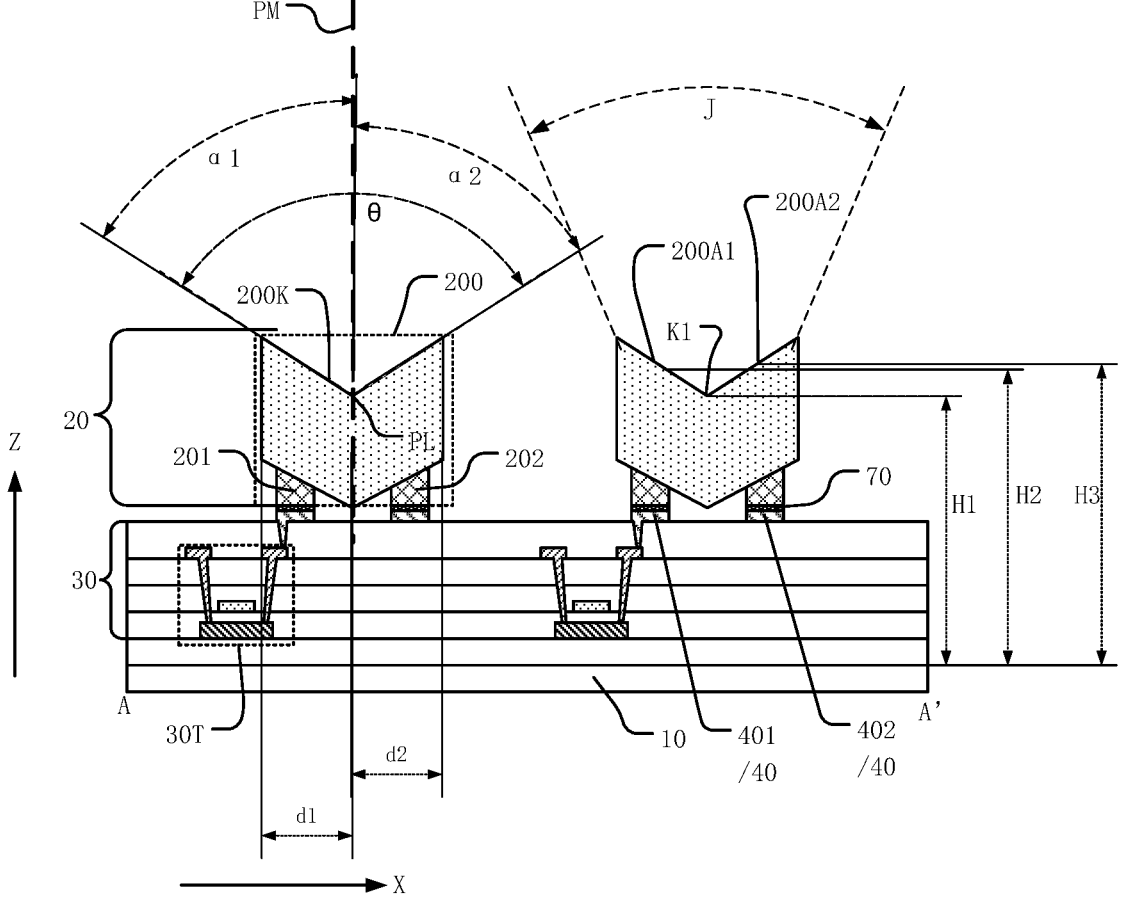
FIG. 2 is a section view taken along direction A-A' in FIG. 1.

Referring to FIGS. 1 and 2, FIG. 1 is a diagram illustrating the planar structure of a display panel according to an embodiment of the present invention. FIG. 2 is a section view taken along direction A-A' in FIG. 1. The display panel 000 provided in this embodiment includes a substrate 10 and a light emission device layer 20. The light emission device layer 20 is located on a side of the substrate 10. The light emission device layer 20 includes multiple light-emitting structures 200.

A light-emitting structure 200 includes at least a first electrode 201 and a second electrode 202. In the direction Z perpendicular to the plane where the substrate 10 is located, the first electrode 201 and the second electrode 202 are located on the side of the light-emitting structure 200 facing the substrate 10. Usually, a light-emitting structure 200 is disposed with a first electrode 201 and a second electrode 202.

A surface on a side of the light-emitting structures 200 facing away from the substrate includes a recess portion 200K. At least part of the surface on the side of the light-emitting structure 200 facing away from the substrate 10 recesses toward a side of the light-emitting structure 200 adjacent to the substrate 10, so that a recess portion 200K is formed.

Specifically, the display panel 000 provided in this embodiment may be a mini light-emitting diode (mini LED) display panel or a micro light-emitting diode (microLED) display panel. The film structure of the display panel 100 includes a substrate 10 and a light emission device layer 20 located on the side of the substrate 10. The substrate 10 may be used as a carrier substrate of the display panel 000 and configured to fabricate and dispose remaining structures of the display panel 000 on the substrate 10. For example, in this embodiment, the substrate 10 is configured to fabricate the light emission device layer 20 located on the side of the substrate 10. Optionally, a driver circuit layer 30 may also be included between the substrate 10 and the light emission device layer 20. The driver circuit layer 30 may include a structure of multiple conductive metal layers and multiple insulating layers. The driver circuit layer 30 may be understood as a film for fabricating a driver circuit structure for driving the light-emitting structure 200 of the light emission device layer 20 to emit light, for example, fabricating circuit structures such as a thin-film transistor 30T and signal wire for driving the light-emitting structure 200 to emit light. The source or drain of the thin-film transistor 30T is electrically connected to the anode of the light-emitting structure 200. In the display panel 000 of this embodiment, the light emission device layer 20 includes multiple light-emitting structures 200. The region in which at least one light-emitting structure 200 is located may be understood as a pixel region in which the display panel 000 is divided. It is to be understood that in this embodiment, description is given with reference to FIG. 1 by using an example in which multiple light-emitting structures 200 are arranged in an array. During specific implementation, the arrangement of the multiple light-emitting structures 200 in the display panel 000 includes but is not limited to this. Optionally, in this embodiment, the light-emitting structure 200 may include any one of a micro light-emitting diode or a mini light-emitting diode. During specific implementation, the light-emitting structure 200 may be transferred to a substrate on which the driver circuit layer 30 and other films are fabricated by mass transfer technology. Optionally, in this embodiment, the film of the display panel 000 includes but not limited to the preceding structure. During specific implementation, the film of the display panel 000 may be disposed according to the structure of the display panel in the related art.

In this embodiment, a light-emitting structure 200 at least includes a first electrode 201 and a second electrode 202. The first electrode 201 may be understood as an anode (P electrode) of the light-emitting structure 200. The second electrode 202 may be understood as a cathode (N electrode) of the light-emitting structure 200. Optionally, in the film structure of the display panel 000, a bonding electrode layer 40 may be included. The bonding electrode layer 40 is located on the side of the driver circuit layer 30 facing away from the substrate 10. The bonding electrode layer 40 may include a first bonding electrode 401 and a second bonding electrode 402. After the light-emitting structure 200 is massively transferred to the side of the substrate 10, the first electrode 201 of the light-emitting structure 200 may be bound and electrically connected to the first bonding electrode 401, and the second first electrode 202 of the light-emitting structure 200 may be bound and electrically connected to the second bonding electrode 402, so that a signal is provided for the light-emitting structure 30 to drive the light-emitting structure 30 to emit light through the structure disposed by the driver circuit layer 30. When the light-emitting structure 200 of the display panel 000 emits light, and after a positive voltage is applied to the first electrode 201 by the structure in the driver circuit layer 30, and a negative voltage is applied to the second electrode 202, an electric field force for driving the light-emitting structure 200 to emit light is generated between the first electrode 201 of the light-emitting structure 200 and the second electrode 202 of the light-emitting structure 200, thereby implementing the light-emitting function of the light-emitting structure 200. It is to be understood that the light-emitting display principle of the display panel 000 including the light-emitting structure 200 is not described in detail in this embodiment. For details, reference may be made to the light-emitting principle of the light-emitting diode in the related art.

In the light-emitting structure 200 of this embodiment, in the direction Z perpendicular to the plane where the substrate 10 is located, the first electrode 201 and the second electrode 202 are located on the side of the light-emitting structure 200 facing the substrate 10. That is, the first electrode 201 of the light-emitting structure 200 and the second electrode 202 of the light-emitting structure 200 are located on the same side of the light-emitting structure 200 facing the substrate 10. The light-emitting structure 200 is a horizontal light-emitting structure. The first electrode 201 and the second electrode 202 are disposed on the same side of the light-emitting structure 200, so that when the light-emitting structure 200 is transferred to the bonding electrode layer 40 on the substrate 10, the first electrode 201 is directly bound and electrically connected to the first bonding electrode 401, and the second electrode 202 is directly bound and electrically connected to the second bonding electrode 402. In this manner, there is no need to dispose another conductive structure and use the conductive structure as the connection structure between an electrode of the light-emitting structure 200 and a bonding electrode on the panel. Thus, it is beneficial to reduce the manufacturing costs and process difficulty, and the panel structure is simplified.

It is to be understood that in this embodiment, the binding and electrical connection method between the first electrode 201 and the first bonding electrode 401 and the binding and electrical connection method between the second electrode 201 and the second bonding electrode 401 are not specifically limited. The binding and electrical connection between the first electrode 201 and the first bonding electrode 401 and the binding and electrical connection between the second electrode 202 and the second bonding electrode 402 may be implemented by a conductive structure 70 such solder or an eutectic layer, and the details are not repeated in this embodiment.

In this embodiment, multiple light-emitting structures 200 of the light emission device layer 20 are disposed. The surface on the side of the light-emitting structure 200 facing away from the substrate 10 includes a recess portion 200K. At least part of the surface on the side of the light-emitting structure 200 facing away from the substrate 10 recesses toward a side of the light-emitting structure 200 adjacent to the substrate 10, so that a recess portion 200K is formed. In this embodiment, the light-emitting structure 200 in the display panel 000 includes the recess portion 200K, so that among at least light emitted from the surface on the side of the light-emitting structure 200 facing away from the substrate 10, the light intensity at a side viewing angle (the side viewing angle may be understood as a viewing angle range that forms a relatively large angle between a line of sight in the side viewing angle and the direction Z perpendicular to the plane where the substrate 10 is located) is reduced, and light from a side viewing angle of each light-emitting structure 200 is reduced. Among light emitted from the surface on the side of the light-emitting structure 200 facing away from the substrate 10, more light can be emitted from a positive viewing angle (the positive viewing angle may be understood as a viewing angle range that parallel to the direction Z perpendicular to the plane where the substrate 10 is located, or a viewing angle range that forms a relatively small angle between a line of sight in the positive viewing angle and the direction Z perpendicular to the plane where the substrate 10 is located, the range J shown in FIG. 2 may be understood as the positive viewing angle range, and the range outside the range J may be understood as the side viewing angle range) range. Compared with the display panel in the related art in which the surface on the side of the light-emitting structure facing away from the substrate is a flat structure, when the display panel 000 of this embodiment is displayed, the amount of total reflected light of light from the side viewing angle of the light-emitting structure 200 inside the film of the panel can be reduced, so that the brightness of the display panel 000 in the positive viewing angle range is improved. Thus, a halo phenomenon is weakened, so that it is beneficial to alleviate a halo problem, thereby improving the display quality.

Figure 3:
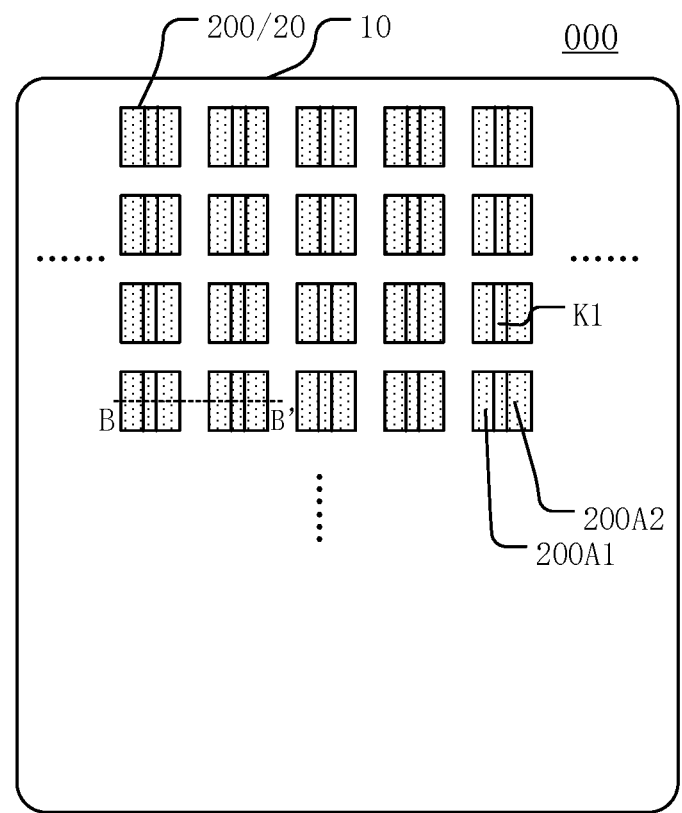
FIG. 3 is a diagram illustrating another planar structure of a display panel according to an embodiment of the present invention.
Figure 4:
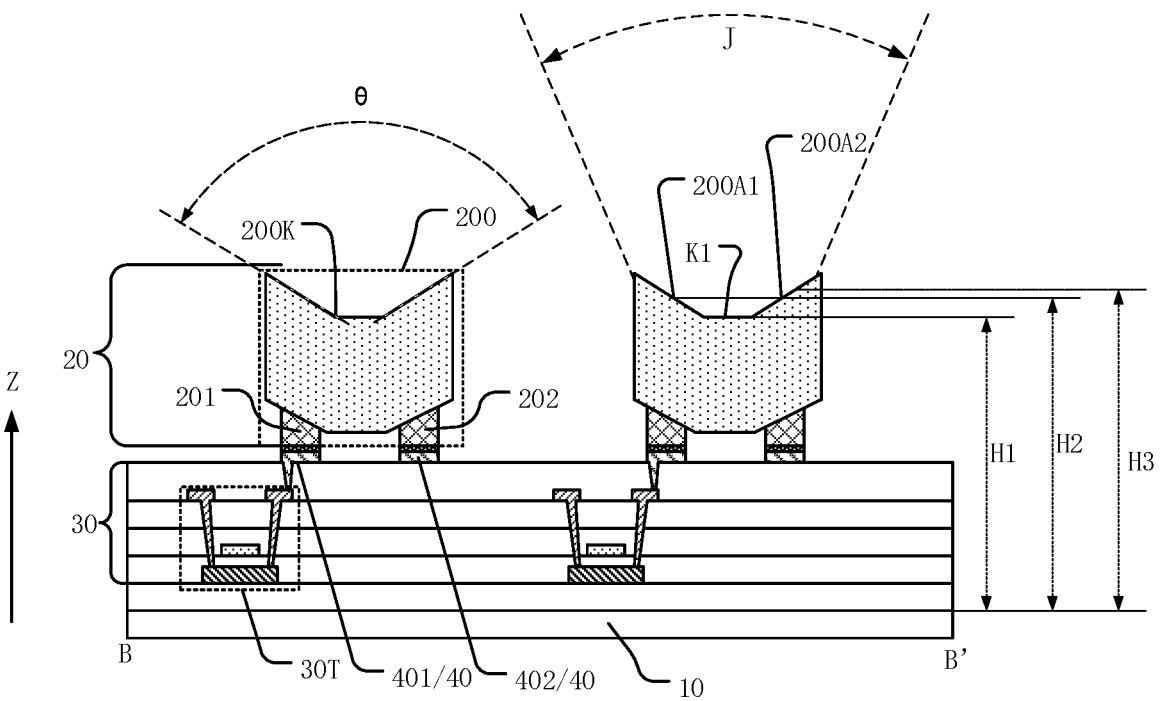
FIG. 4 is a section view taken along direction B-B' in FIG. 3.
Figure 5:
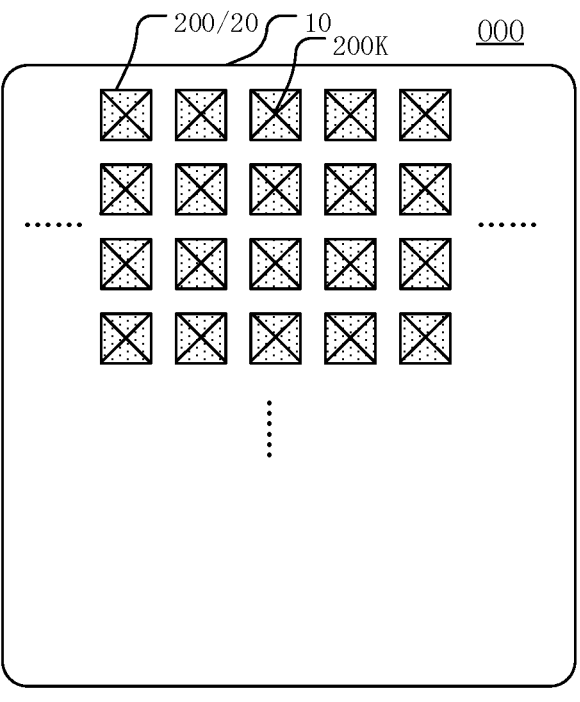
FIG. 5 is a diagram illustrating another planar structure of a display panel according to an embodiment of the present invention.
Figure 6:
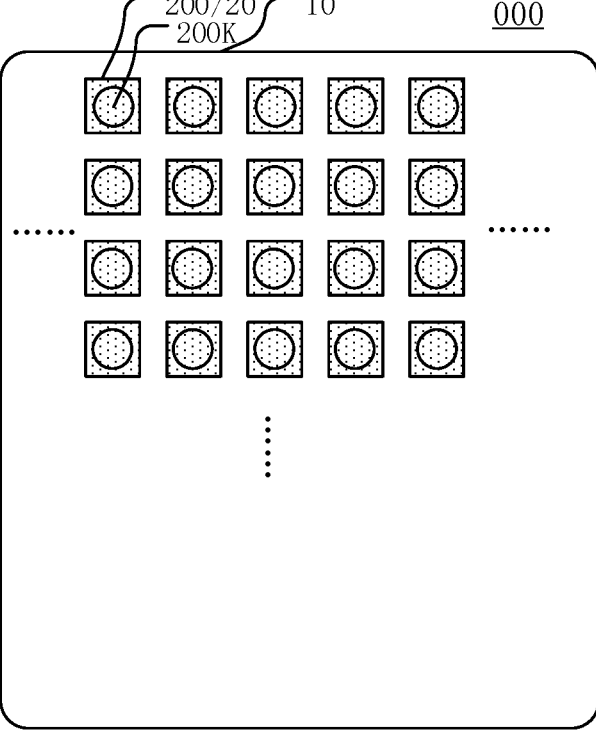
FIG. 6 is a diagram illustrating another planar structure of a display panel according to an embodiment of the present invention.

Optionally, the specific shape of the recess portion 200K is not limited in this embodiment. The shape of the recess portion 200K may be shown in FIGS. 1 and 2. The recess portion 200K is a V-shaped structure including two intersecting surfaces. Alternatively, in some other optional embodiments, as shown in FIGS. 3 and 4, FIG. 3 is a diagram illustrating another planar structure of a display panel according to an embodiment of the present invention. FIG. 4 is a section view taken along direction B-B' in FIG. 3. The recess portion 200K is a structure including three surfaces, and two of three surfaces form a V shape. Alternatively, as shown in FIG. 5, FIG. 5 is a diagram illustrating another planar structure of a display panel according to an embodiment of the present invention. The recess portion 200K may also be a tetrahedral pyramid structure. Alternatively, if the process is controllable, or as shown in FIG. 6, FIG. 6 is a diagram illustrating another planar structure of a display panel according to an embodiment of the present invention, the recess portion 200K may be a conical structure, so that in the light-emitting structure 200, the uniformity of light in all directions emitted from the recess portion 200K is better. In this embodiment, description is given with reference to FIGS. 1 and 2 by using an example in which the recess portion 200K is a V-shaped structure including two intersecting surfaces. During specific implementation, the shape of the recess portion 200K may be set according to actual requirements. It only needs to satisfy the requirement that for the recess portion 200K disposed on the side of the light-emitting structure 200 facing away from the substrate 10, the distance from the middle position of the recess portion 200K to the substrate 10 is less than the distance from the edge position of the recess portion 200K to the substrate 10 to form a shape in which the side of the light-emitting structure 200 facing away from the substrate 10 is concave. It is to be noted that in subsequent embodiments, the recess portion 200K of the light-emitting structure 200 is described by using the shape of FIGS. 1 and 2.

It is to be understood that the drawings of this embodiment are only examples to illustrate the structure of the display panel 000. During specific implementation, the structure of the display panel 000 includes but is not limited to this and may include other film structures. For example, the drive circuit layer 30 may include an anode line and a cathode line, and the side of the light-emitting device layer 20 facing away from the substrate 10 may also include a color conversion layer and an encapsulation layer, and the details are not repeated in this embodiment. For details, reference may be made to the film structure of the display panel in the related art.

Figure 7:
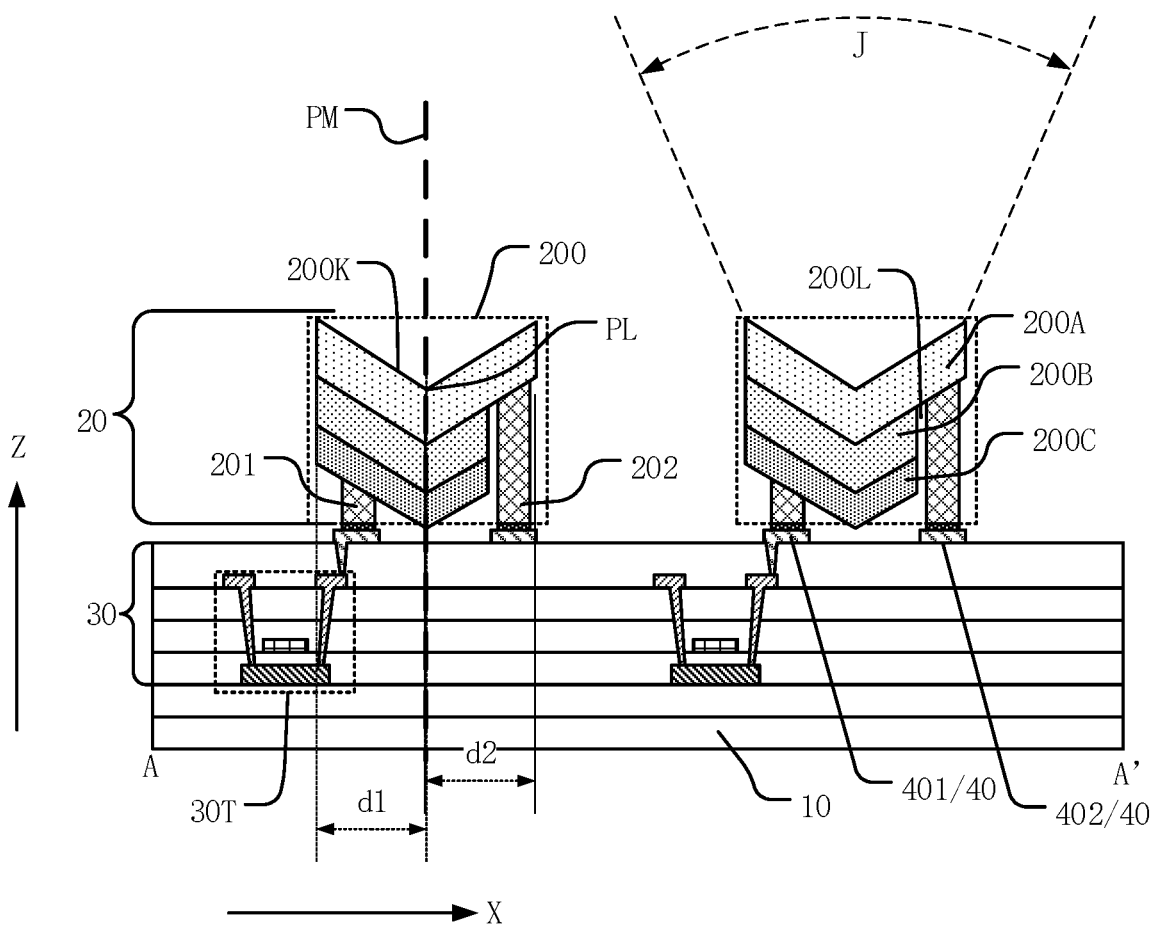
FIG. 7 is another section view taken along direction A-A' in FIG. 1.

In some optional embodiments, referring to FIGS. 1 and 7, FIG. 7 is another section view taken along direction A-A' in FIG. 1. In this embodiment, in the direction Z perpendicular to the plane where the substrate 10 is located, the light-emitting structure 200 includes an n-type semiconductor layer 200A, a quantum well layer 200B, and a p-type semiconductor layer 200C stacked. The first electrode 201 is connected to the p-type semiconductor layer 200C, and the second electrode 202 is connected to the n-type semiconductor layer 200A.

The side of the light-emitting structure 200 facing the substrate 10 includes a hollow portion 200L extending through the quantum well layer 200B and the p-type semiconductor layer 200C. The second electrode 201 is connected to the n-type semiconductor layer 200A in the hollow portion 200L.

This embodiment illustrates that the light-emitting structure 200 may include an n-type semiconductor layer 200A, a quantum well layer 200B, and a p-type semiconductor layer 200C stacked in the direction Z perpendicular to the plane where the substrate 10 is located. Optionally, the quantum well layer 200B may be any one of a single quantum well layer or a multi-quantum well layer. This is not limited in this embodiment. When the light-emitting structure 200 emits light, since the first electrode 201 is connected to the p-type semiconductor layer 200C, and the second electrode 202 is connected to the n-type semiconductor layer 200A, the first electrode 201 may be understood as an anode (P electrode) of the light-emitting structure 200, and the second electrode 202 may be understood as a cathode (N electrode) of the light-emitting structure 200. The first electrode 201 is bound to the first bonding electrode 401 on the driver circuit layer 30. The second electrode 202 is bound to the second bonding electrode 402 on the driver circuit layer 30. Voltage signals are provided to the first electrode 201 of the light-emitting structure 200 and the second electrode 202 of the light-emitting structure 200 through the driver circuit structure of the driver circuit layer 30 respectively. For example, after a positive voltage is applied to the first electrode 201, and a negative voltage is applied to the second electrode 202 (that is, a positive voltage is applied to the light-emitting structure 200), holes injected into the n-type semiconductor layer 200A by the p-type semiconductor layer 200C are recombined with electrons of the n-type semiconductor layer 200A adjacent to a PN junction. Electrons injected into the p-type semiconductor layer 200C by the n-type semiconductor layer 200A are recombined with holes in the p-type semiconductor layer 200C adjacent to the PN junction. In this manner, spontaneous radiation light is generated, thereby implementing the light-emitting function of the light-emitting structure 200. It is to be understood that the light-emitting principle of the light-emitting structure 200 is not described in detail in this embodiment. For details, reference may be made to the light-emitting principle of the light-emitting diode in the related art.

In this embodiment, the light-emitting structure 200 is a horizontal light-emitting structure. That is, the first electrode 201 of the light-emitting structure 200 and the second electrode 202 of the light-emitting structure 200 are located on the same side of the light-emitting structure 200 facing the substrate 10. Thus, to implement the electrical connection between the second electrode 202 and the n-type semiconductor layer 200A, in this embodiment, the side of the light-emitting structure 200 facing the substrate 10 includes a hollow portion 200L extending through the thickness of the quantum well layer 200B and the thickness of the p-type semiconductor layer 200C. In this manner, the second electrode 201 is electrically connected to the n-type semiconductor layer 200A in the hollow portion 200L.

It is to be understood that since for the light-emitting structure 200, generally, each film of the light-emitting structure 200 is grown on a growth substrate, and then the light-emitting structure 30 may be transferred to a substrate on which structures such as the driver circuit layer 30 and the bonding electrode layer 40 are fabricated by mass transfer technology. Thus, the structure of the n-type semiconductor layer 200A, the quantum well layer 200B, and the p-type semiconductor layer 200C of the light-emitting structure 200 may also be a film structure having a recess region. It is only necessary to preset a raised structure consistent with the shape of the to-be-formed recess portion 200K on the growth substrate, and then the n-type semiconductor layer 200A, the quantum well layer 200B, the p-type semiconductor layer 200C, and the electrode layer may be grown layer by layer, so that the recess portion 200K may be formed on the side of the light-emitting structure 200 adjacent to the n-type semiconductor layer 200A. After the light-emitting structure 200 is transferred onto the substrate 10 of the display panel 000, the side of the light-emitting structure 200 facing away from the substrate 10, that is, the side of the n-type semiconductor layer 200A facing away from the substrate 10 may have a recess portion 200K. It is to be noted that the specific growth process of the light-emitting structure 200 is not described in detail in this embodiment. During specific implementation, reference may be made to the growth process of the light-emitting chip in the related art for understanding. It is only required that the growth substrate (such as a sapphire substrate) has a raised structure matching the recess portion 200K before the growth of the films of the light-emitting structure 200.

In some optional embodiments, further referring to FIGS. 1 to 4, in this embodiment, the light-emitting structure 200 includes a first surface 200A1 and a second surface 200A2 on the side facing away from the substrate 10. The first surface 200A1 intersects the second surface 200A2 at a first position K1. In the direction Z perpendicular to the plane where the substrate 10 is located, the distance H1 from the first position K1 to the substrate 10 is less than distances H2 from other positions in the first surface 200A1 to the substrate 10, and the distance H1 from the first position K1 to the substrate 10 is less than distances H3 from other positions in the second surface 200A2 to the substrate 10.

This embodiment illustrates that the light-emitting structure 200 is provided with a recess portion 200K on the side of the light-emitting structure 200 facing away from the substrate 10, and the surface on the side of the light-emitting structure 200 facing away from the substrate 10 recesses toward the side adjacent to the substrate 10, so that the recess portion 200 is formed. In this manner, the surface on the side of the light-emitting structure 200 facing away from the substrate 10 may at least include a first surface 200A1 and a second surface 200A2. The first surface 200A1 may intersect the second surface 200A2 at the first position K1, and the first position K1 is a line. Alternatively, as shown in FIGS. 3 and 4, the plane where the first surface 200A1 is located may intersect the plane where the second surface 200A2 is located at the first position K1, and the first position K1 is a region. In the recess portion 200 structure formed by the first surface 200A1 and the second surface 200A2, in the direction Z perpendicular to the plane where the substrate 10 is located, the distance H1 from the first position K1 to the substrate 10 is less than distances H2 from other positions in the first surface 200A1 to the substrate 10, and the distance H1 from the first position K1 to the substrate 10 is less than distances H3 from other positions in the second surface 200A2 to the substrate 10. That is, on the surface on the side of the light-emitting structure 200 facing away from the substrate 10, the more adjacent to the first position K1, the less the distance between the surface on the side of the light-emitting structure 200 facing away from the substrate 10 and the substrate 10 is, and the farther away from the first position K1, the greater the distance between the surface on the side of the light-emitting structure 200 facing away from the substrate 10 and the substrate 10 is. Thus, the surface on the side of the light-emitting structure 200 facing away from the substrate 10 forms a concave structure. The recess portion 200K is disposed, so that when the display panel 000 is displayed, the amount of total reflected light of the light from the side viewing angle of the light-emitting structure 200 inside the film of the panel can be greatly reduced, so that the brightness of the display panel 000 in the positive viewing angle range is improved. Thus, a halo phenomenon is weakened, thereby improving the display quality.

In some optional embodiments, further referring to FIGS. 1 to 4, in this embodiment, the included angle between the first surface 200A1 and the second surface 200A2 is θ, and θ≥150°.

This embodiment illustrates that in the recess portion 200 structure formed by the first surface 200A1 and the second surface 200A2, the included angle formed by the intersection of the first surface 200A1 and the second surface 200A2 is θ. Alternatively, the included angle formed by the intersection of the plane where the first surface 200A1 is located and the plane where the second surface 200A2 is located is θ. θ is greater than or equal to 150°. Thus, it is possible to avoid that the recess portion 200K greatly recesses toward the side adjacent to the substrate 10, that is, it is possible to avoid the excessive inclination of the first surface 200A1, which causes the light emitted from the first surface 200A1 to be emitted into the side viewing angle of the right side of the figure. Moreover, it is possible to avoid the excessive inclination of the second surface 200A2, which causes the light emitted from the second surface 200A2 to be emitted into the side viewing angle of the left side of the figure. Thus, it is possible to avoid the problem of increasing the light from the side viewing angle in a disguised form. It is beneficial to ensure that the maximum light-emitting angle of each light-emitting structure 200 is still maintained in the positive viewing angle range (the J range as shown in the figure), so that the brightness of the display panel 000 in the positive viewing angle range is improved. Thus, a halo is weakened, thereby improving the display quality.

Figure 8:
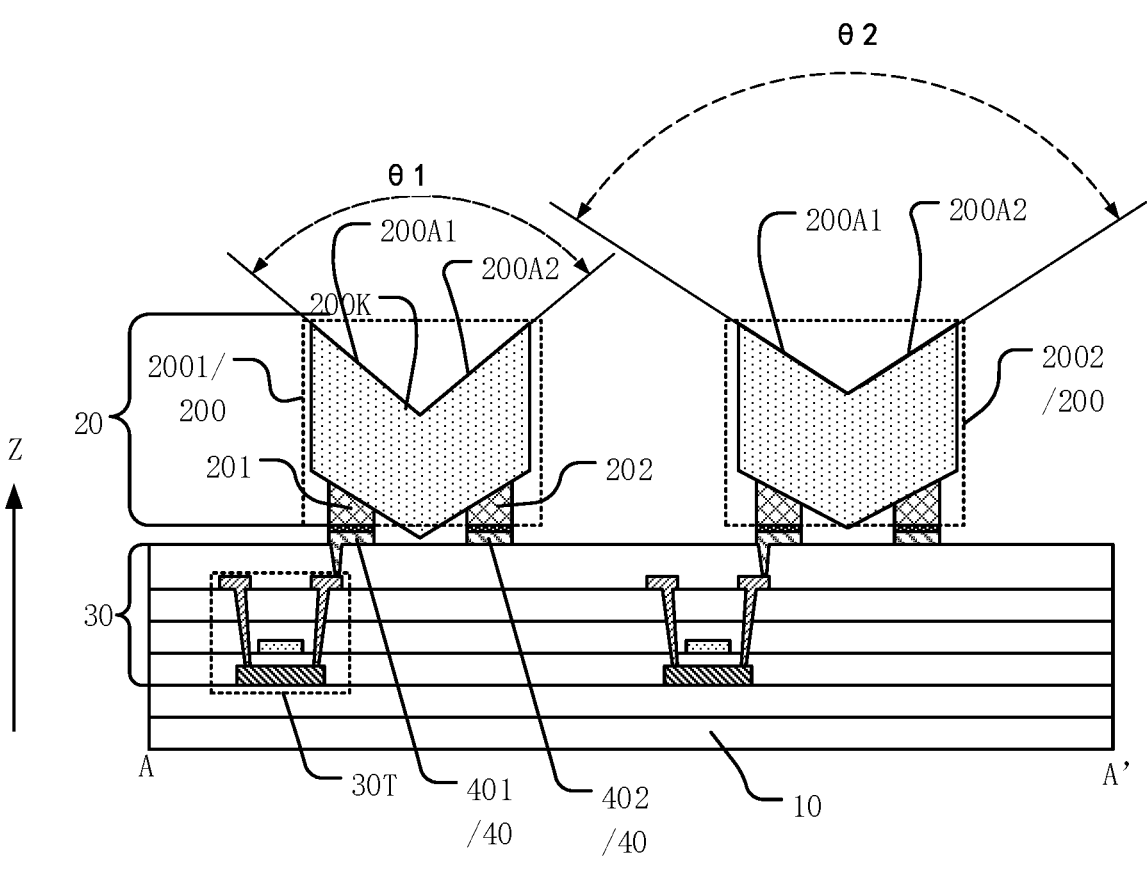
FIG. 8 is another section view taken along direction A-A' in FIG. 1.

In some optional embodiments, referring to FIGS. 1 and 8, FIG. 8 is another section view taken along direction A-A' in FIG. 1. In this embodiment, multiple light-emitting structures 200 at least include a first color light-emitting structure 2001 and a second color light-emitting structure 2002. The included angle between a first surface 200A1 and a second surface 200A2 of the first color light-emitting structure 2001 is θ1, and the included angle between a first surface 200A1 and a second surface 200A2 of the second color light-emitting structure 2002 is θ2, where θ1<θ2.

This embodiment illustrates that the recess degrees of the recess portions 200K of light-emitting structures 200 of different colors may be different. Specifically, multiple light-emitting structures 200 at least include a first color light-emitting structure 2001 and a second color light-emitting structure 2002. Optionally, the first color light-emitting structure 2001 may be a green light-emitting structure, and the second color light-emitting structure 2002 may be a blue light-emitting structure. Alternatively, the first color light-emitting structure 2001 may be a red light-emitting structure, and the second color light-emitting structure 2002 may be a green light-emitting structure. Alternatively, the first color light-emitting structure 2001 may be a red light-emitting structure, and the second color light-emitting structure 2002 may be a blue light-emitting structure. That is, due to the characteristics of a light-emitting chip, the light-emitting efficiency of a green light-emitting structure is generally lower than the light-emitting efficiency of a blue light-emitting structure, the light-emitting efficiency of a red light-emitting structure is generally lower than the light-emitting efficiency of the blue light-emitting structure, and the light-emitting efficiency of the red light-emitting structure is generally lower than the light-emitting efficiency of the green light-emitting structure. For this reason, the included angle θ1 between the first surface 200A1 and the second surface 200A2 of the first color light-emitting structure 2001 having low light-emitting efficiency may be set to be less than the included angle θ2 between the first surface 200A1 and the second surface 200A2 of the first color light-emitting structure 2001 having high light-emitting efficiency. Thus, the recess degree of the recess portion 200K of the first color light-emitting structure 2001 having low light-emitting efficiency is increased, so that the light flux per unit area when the first color light-emitting structure 2001 having low light-emitting efficiency emits light is increased. In this manner, it is beneficial to increase the light-emitting brightness of the first color light-emitting structure 2001 having low light-emitting efficiency, and the display difference caused by the difference in light-emitting efficiency is balanced, thereby further improving the display quality.

Figure 9:
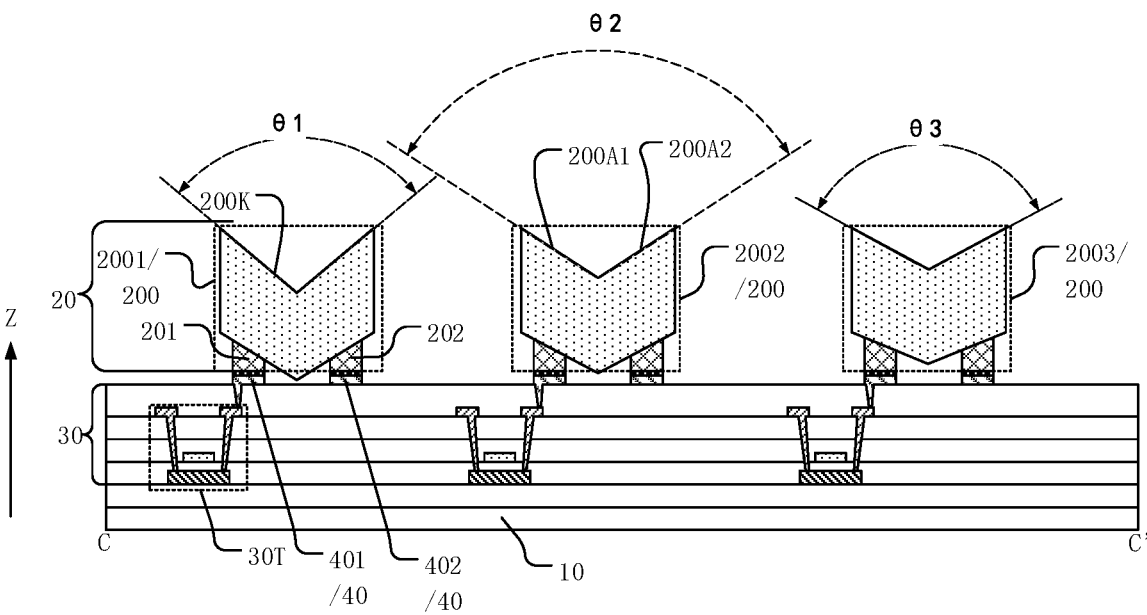
FIG. 9 is a section view taken along direction C-C' in FIG. 1.

Optionally, as shown in FIGS. 1 and 9, FIG. 9 is a section view taken along direction C-C' in FIG. 1. The multiple light-emitting structures 200 at least include a first color light-emitting structure 2001, a second color light-emitting structure 2002, and a third color light-emitting structure 2003. The first color light-emitting structure 2001 may be a red light-emitting structure, the second color light-emitting structure 2002 may be a green light-emitting structure, and the third color light-emitting structure 2003 may be a blue light-emitting structure. The light-emitting efficiency of the first color light-emitting structure 2001 is lower than the light-emitting efficiency of the second color light-emitting structure 2002. The light-emitting efficiency of the second color light-emitting structure 2001 is lower than the light-emitting efficiency of the third color light-emitting structure 2003. The included angle θ1 between the first surface 200A1 and the second surface 200A2 of the first color light-emitting structure 2001 may be set to be less than the included angle θ2 between the first surface 200A1 and the second surface 200A2 of the second color light-emitting structure 2002. The included angle θ2 between the first surface 200A1 and the second surface 200A2 of the second color light-emitting structure 2002 may be set to be less than the included angle θ3 between a first surface 200A1 and a second surface 200A2 of the third color light-emitting structure 2003. In this manner, the light flux per unit area when the first color light-emitting structure 2001 having low light-emitting efficiency emits light is increased, and the display difference caused by the difference in light-emitting efficiency of light-emitting structures of different colors is balanced, thereby further improving the display quality.

It is to be understood that in this embodiment, the light-emitting structures 200 included in the light emission device layer 20 may be light-emitting structures of different colors. The light-emitting structures of different colors may be implemented by the fact that the light-emitting structures 200 are of different colors. Alternatively, the light-emitting structures 200 may be structures of the same color. For example, the light-emitting structures 200 may all be blue light-emitting chips. The light-emitting structures 200 may include a color conversion portion (not shown) on the side of the light-emitting structures 200 facing away from the substrate 10. The color conversion portion may be a quantum dot material. Different colors of the light-emitting structures 200 may be implemented by the color conversion portion. During specific implementation, the implementation of the light-emitting structures 200 of different colors may be selected according to actual requirements, and the details are not repeated in this embodiment.

In some optional embodiments, further referring to FIGS. 1 and 2, in this embodiment, the included angle formed between the first surface 200A1 and a first reference plane PM is α1, and the included angle formed between the second surface 200A2 and the first reference plane PM is α2, where α1=α2. The line where the first surface 200A1 intersects the second surface 200A2 is a first line PL (it is to be understood that the first line PL in FIG. 2 is embodied as a point). The first reference plane PM passes through the first line PL and is perpendicular to the plane where the substrate 10 is located.

This embodiment illustrates that the light-emitting structure 200 includes a first surface 200A1 and a second surface 200A2 on the side facing away from the substrate 10. The first surface 200A1 and the second surface 200A2 form the shape of the recess portion 200K. The line where the first surface 200A1 intersects the second surface 200A2 is the first line PL. A plane passing through the first line PL and perpendicular to the plane where the substrate 10 is located is defined as the first reference plane PM. The included angle α1 formed between the first surface 200A1 and the first reference plane PM is set to be equal to the included angle α2 formed between the second surface 200A2 and the first reference plane PM. That is, the first surface 200A1 and the second surface 200A2 may be understood as a symmetrical structure along the first reference plane PM, so that the inclination of the first surface 200A1 and the inclination of the second surface 200A2 of the recess portion 200K may be consistent. In this manner, it is beneficial to reduce the growth difficulty of the films of the light-emitting structure 200, thereby improving the process efficiency of the light-emitting structure 200.

Optionally, as shown in FIGS. 1, 2, and 7, in the direction X parallel to the plane where the substrate 10 is located, in the direction of the first electrode 201 pointing to the second electrode 202, the width of the orthographic projection of the first surface 200A1 on the plane where the substrate 10 is located is d1, and the width of the orthographic projection of the second surface 200A2 on the plane where the substrate 10 is located is d2, where d1=d2.

This embodiment illustrates that the first surface 200A1 and the second surface 200A2 are the symmetrical structure along the first reference plane PM, so that when the inclination of the first surface 200A1 and the inclination of the second surface 200A2 of the recess portion 200K are consistent, in the direction of the first electrode 201 pointing to the second electrode 202, the width d1 of the orthographic projection of the first surface 200A1 on the plane where the substrate 10 is located may also be set to be equal to the width d2 of the orthographic projection of the second surface 200A2 on the plane where the substrate 10 is located. In this manner, when the films of the light-emitting structure 200 (such as the n-type semiconductor layer 200A) are grown on the growth substrate, to form the recess portion 200K, the raised structure disposed on the growth substrate may be a symmetrical and regularly arranged triangular structure. Thus, the subsequent mass transfer of the light-emitting structure 200 is facilitated, thereby improving the overall process efficiency of the display panel 000.

Figure 10:
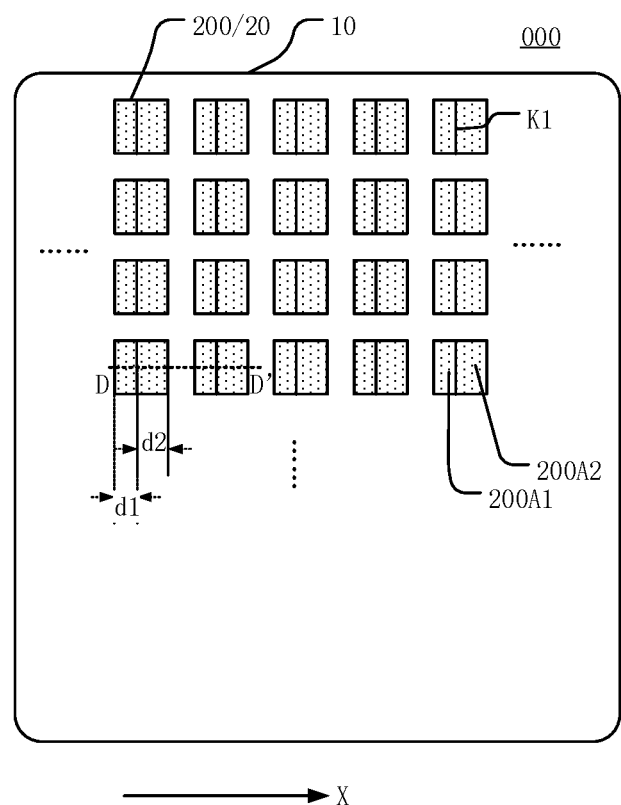
FIG. 10 is a diagram illustrating another planar structure of a display panel according to an embodiment of the present invention.
Figure 11:
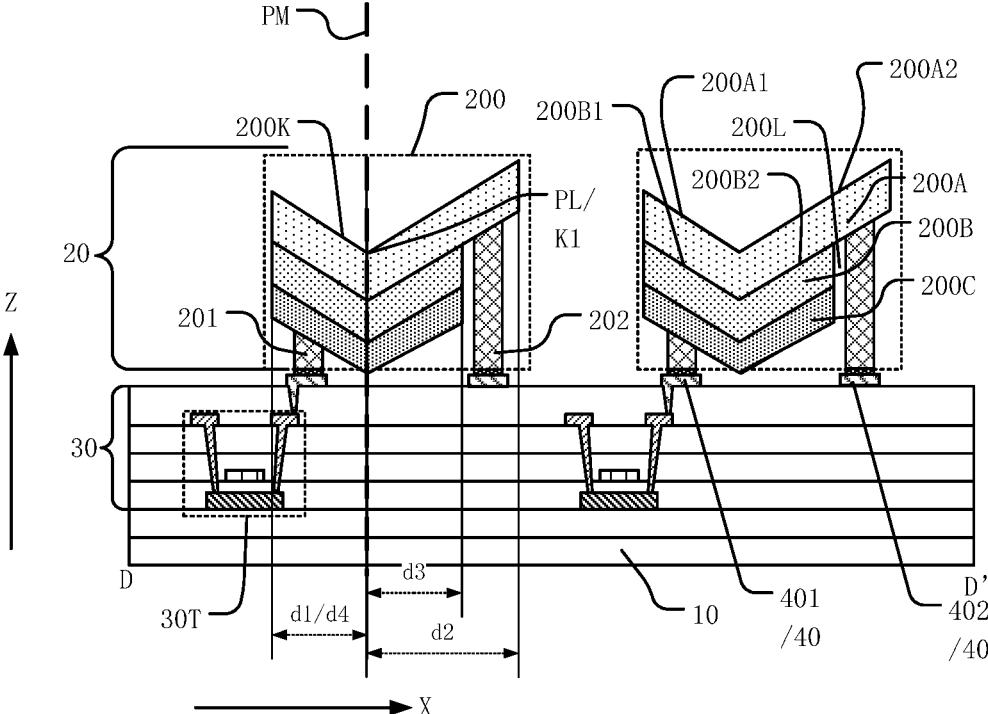
FIG. 11 is a section view taken along direction D-D' in FIG. 10.

In some optional embodiments, referring to FIGS. 10 and 11, FIG. 10 is a diagram illustrating another planar structure of a display panel according to an embodiment of the present invention, and FIG. 11 is a section view taken along direction D-D' in FIG. 10. In this embodiment, in the direction X parallel to the plane where the substrate 10 is located, the first surface 200A1 and the first electrode 201 are located on the same side of the first position K1, and the second surface 200A2 and the second electrode 202 are located on the same side of the first position K1.

In the direction of the first electrode 201 pointing to the second electrode 202, the width of the orthographic projection of the first surface 200A1 on the plane where the substrate 10 is located is d1, and the width of the orthographic projection of the second surface 200A2 on the plane where the substrate 10 is located is d2, where d1<d2.

Optionally, in the direction Z perpendicular to the plane where the substrate 10 is located, the light-emitting structure 200 includes an n-type semiconductor layer 200A, a quantum well layer 200B, and a p-type semiconductor layer 200C stacked. The first electrode 201 is connected to the p-type semiconductor layer 200C, and the second electrode 202 is connected to the n-type semiconductor layer 200A.

In the direction X parallel to the plane where the substrate 10 is located, the quantum well layer 200B includes a third surface 200B1 and a fourth surface 200B2 located on opposite sides of the first position K1. The third surface 200B1 and the first electrode 201 are located on the same side of the first position K1. The fourth surface 200B2 and the second electrode 202 are located on the same side of the first position K1.

In the direction of the first electrode 201 pointing to the second electrode 202, the width of the orthographic projection of the first surface 200A1 on the plane where the substrate 10 is located is d1, and the width of the orthographic projection of the fourth surface 200B2 on the plane where the substrate 10 is located is d3, where d1=d3. Further, optionally, the width d3 of the orthographic projection of the fourth surface 200B2 on the plane where the substrate 10 is located is less than the width d2 of the orthographic projection of the second surface 200A2 on the plane where the substrate 10 is located.

This embodiment illustrates that the first surface 200A1 and the second surface 200A2 are the symmetrical structure along the first reference plane PM, so that when the inclination of the first surface 200A1 and the inclination of the second surface 200A2 of the recess portion 200K are consistent, in the direction of the first electrode 201 pointing to the second electrode 202, the width d1 of the orthographic projection of the first surface 200A1 on the plane where the substrate 10 is located is less than the width d2 of the orthographic projection of the second surface 200A2 on the plane where the substrate 10 is located. That is, the width d2 of the orthographic projection of the second surface 200A2 on the plane where the substrate 10 is located is greater. Optionally, the second surface 200A2 and the second electrode 202 are located on the same side of the first position K1. The film structure of the light-emitting structure 200 may include an n-type semiconductor layer 200A, a quantum well layer 200B, and a p-type semiconductor layer 200C stacked. The first electrode 201 is connected to the p-type semiconductor layer 200C, and the second electrode 202 is connected to the n-type semiconductor layer 200A, In the direction X parallel to the plane where the substrate 10 is located, the quantum well layer 200B includes a third surface 200B1 and a fourth surface 200B2 located on opposite sides of the first position K1. The quantum well layer 200B formed by the third surface 200B1 and the fourth surface 200B2 may also be a structure including a recess surface. The first surface 200A1, the third surface 200B1, and the first electrode 201 are located on the same side of the first position K1. The second surface 200A2, the fourth surface 200B2, and the second electrode 202 are located on the same side of the first position K1. Since the quantum well layer 200B is a light-emitting layer of the light-emitting structure 200, to connect the second electrode 202 to the n-type semiconductor layer 200A, after the quantum well layer 200B is formed with the hollow portion 200L, in the direction of the first electrode 201 pointing to the second electrode 202, the width d1 of the orthographic projection of the first surface 200A1 on the plane where the substrate 10 is located may be set to be less than the width d2 of the orthographic projection of the second surface 200A2 on the plane where the substrate 10 is located, so that the width d2 of the orthographic projection of the second surface 200A2 on the plane where the substrate 10 is located is extended. In this manner, in the direction of the first electrode 201 pointing to the second electrode 202, the width d4 of the orthographic projection of the third surface 200B1 of the quantum well layer 200B on the plane where the substrate 10 is located is equal to the width d3 of the orthographic projection of the fourth surface 200B2 on the plane where the substrate 10 is located. That is, the width d1 of the orthographic projection of the first surface 200A1 of the recess portion 200K on the plane where the substrate 10 is located is equal to the width d4 of the orthographic projection of the third surface 200B1 of the quantum well layer 200B on the plane where the substrate 10 is located and also equal to the width d3 of the orthographic projection of the fourth surface 200B2 of the quantum well layer 200B on the plane where the substrate 10 is located. Thus, the light-emitting layer (that is, the quantum well layer 200B) of a single light-emitting structure 200 can be a symmetrical structure having the same inclination and the same width on the substrate 10, so that the light-emitting brightness of the inclined surfaces, on two sides of the first position K1, of the quantum well layer 200B of the single light-emitting structure 200 is approximately equal, and then it is beneficial to balance the light-emitting brightness on two sides of the first position K1. In this manner, the light-emitting uniformity of the light-emitting structure 200 is ensured as much as possible, thereby ensuring the display quality better.

Figure 12:
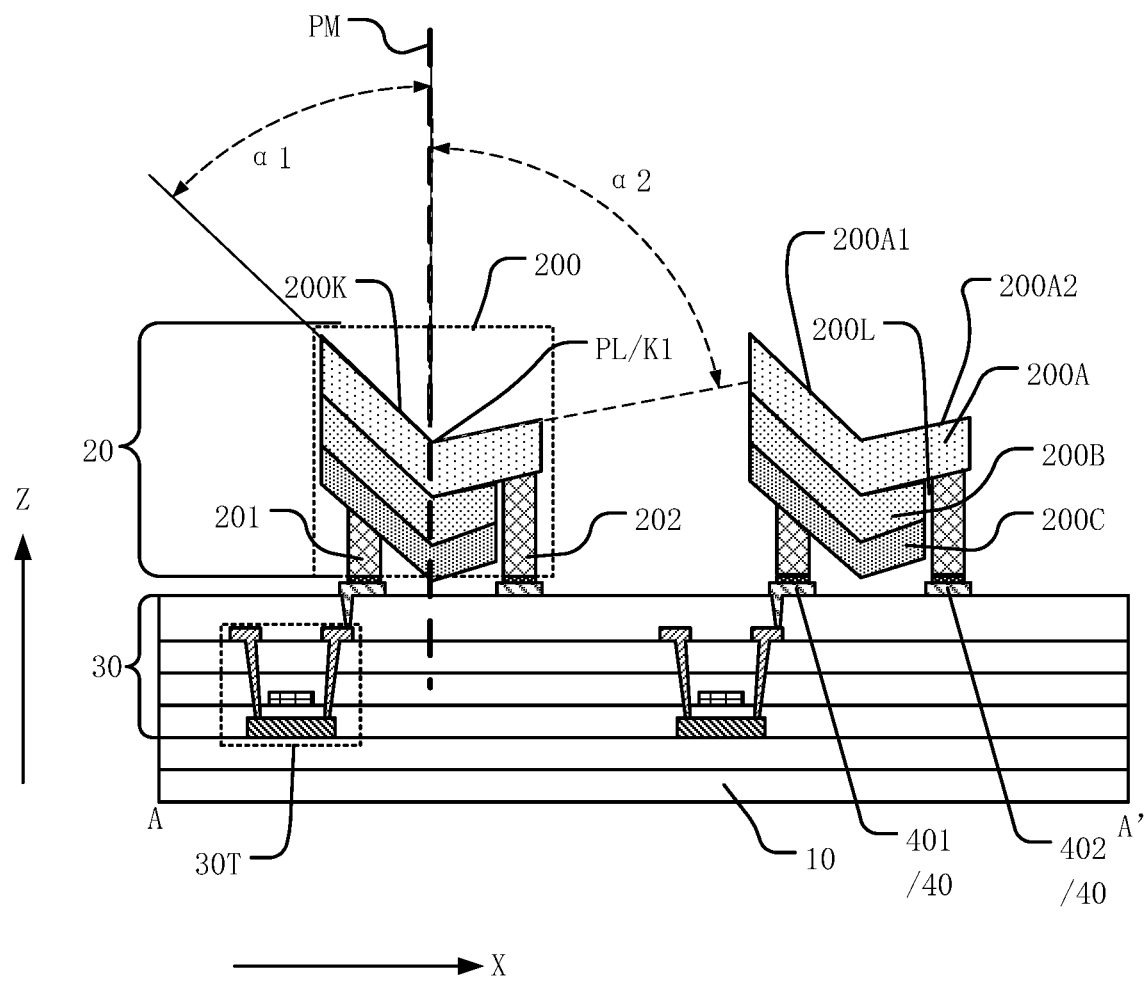
FIG. 12 is another section view taken along direction A-A' in FIG. 1.

In some optional embodiments, referring to FIGS. 1 and 12, FIG. 12 is another section view taken along direction A-A' in FIG. 1. In this embodiment, the included angle formed between the first surface 200A1 and the first reference plane PM is α1, and the included angle formed between the second surface 200A2 and the first reference plane PM is α2, where α1 is not equal to α2. The line where the first surface 200A1 intersects the second surface 200A2 is the first line PL (it is to be understood that the first line PL in FIG. 12 is embodied as a point). The first reference plane PM passes through the first line PL and is perpendicular to the plane where the substrate 10 is located.

Optionally, in the direction X parallel to the plane where the substrate 10 is located, the first surface 200A1 and the first electrode 201 are located on the same side of the first position K1, and the second surface 200A2 and the second electrode 202 are located on the same side of the first position K1, where α1<α2.

This embodiment illustrates that the light-emitting structure 200 includes a first surface 200A1 and a second surface 200A2 on the side facing away from the substrate 10. The first surface 200A1 and the second surface 200A2 form the shape of the recess portion 200K. The line where the first surface 200A1 intersects the second surface 200A2 is the first line PL. The plane passing through the first line PL and perpendicular to the plane where the substrate 10 is located is defined as the first reference plane PM. The included angle α1 formed between the first surface 200A1 and the first reference plane PM may be set to be not equal to the included angle α2 formed between the second surface 200A2 and the first reference plane PM. For example, in the direction X parallel to the plane where the substrate 10 is located, the first surface 200A1 and the first electrode 201 are located on the same side of the first position K1, and the second surface 200A2 and the second electrode 202 are located on the same side of the first position K1, so that the included angle α1 formed between the first surface 200A1 and the first reference plane PM may be set to be less than the included angle α2 formed between the second surface 200A2 and the first reference plane PM. Thus, it is possible to increase the included angle α2 formed between the second surface 200A2 and the first reference plane PM on the side of the hollow portion 200L to reduce the height difference between the first electrode 201 and the second electrode 202. In this manner, when the light-emitting structure 200 is massively transferred to the films on a side of the substrate 10 of the display panel 000, it is beneficial to make the contact between the first electrode 201 and the first bonding electrode 401 stable and the contact between the second electrode 202 and the second bonding electrode 402 stable, thereby ensuring the stability of the electrical connection.

Further, optionally, in some other optional embodiments, the included angle α1 formed between the first surface 200A1 and the first reference plane PM may be set to be less than the included angle α2 formed between the second surface 200A2 and the first reference plane PM, so that in the direction Z perpendicular to the plane where the substrate 10 is located, the height of the first electrode 201 and the height of the second electrode 202 are equal (not shown). Thus, the height difference between the first electrode 201 and the second electrode 202 may be further reduced, and the binding difficulty between the first electrode 201 and the first bonding electrode 401 and the binding difficulty between the second electrode 202 and the second bonding electrode 402 are reduced better.

Figure 13:
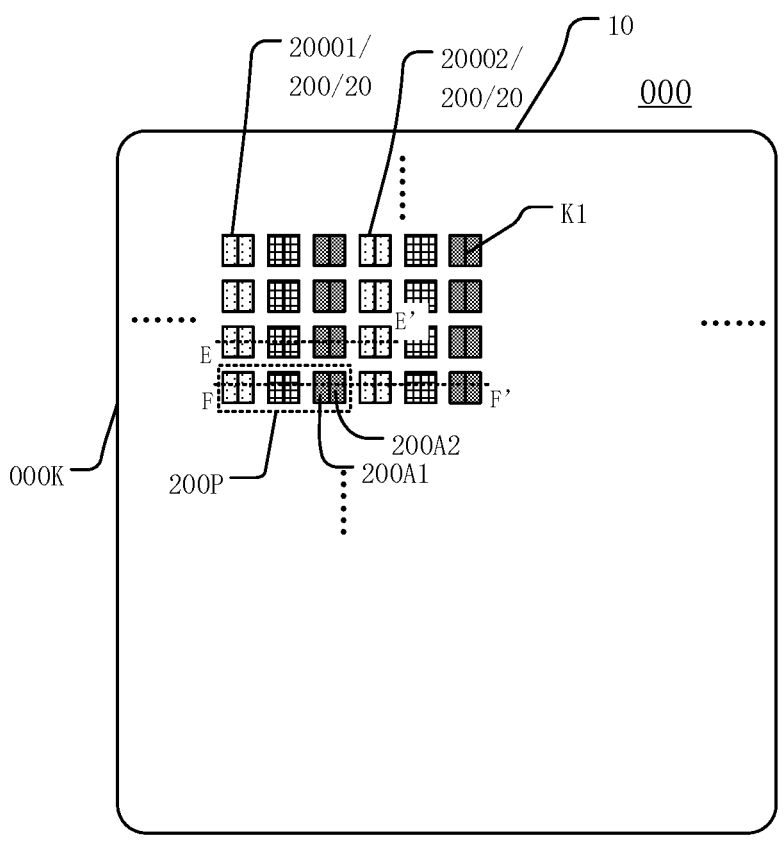
FIG. 13 is a diagram illustrating another planar structure of a display panel according to an embodiment of the present invention.
Figure 14:
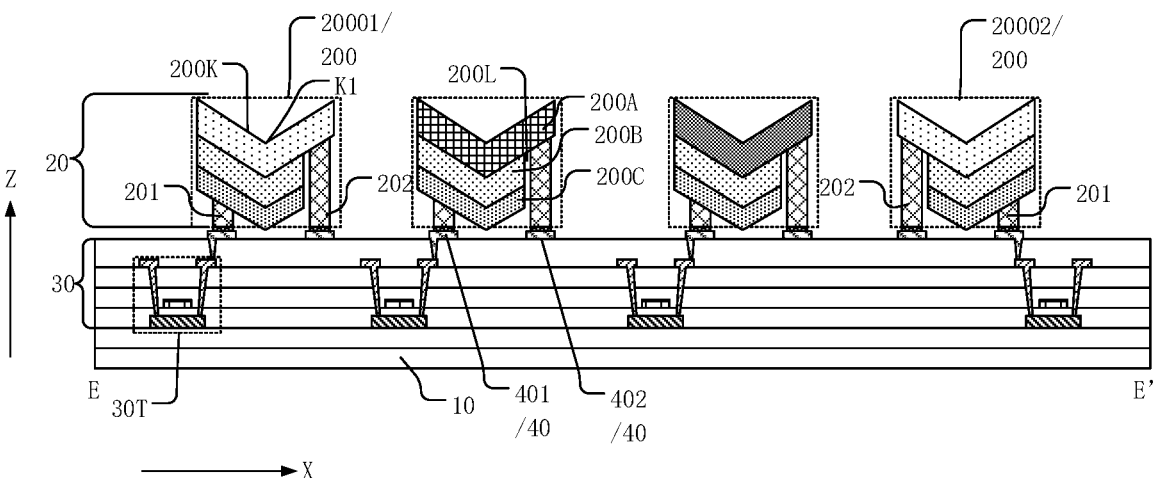
FIG. 14 is a section view taken along direction E-E' in FIG. 13.

In some optional embodiments, referring to FIGS. 13 and 14, FIG. 13 is a diagram illustrating another planar structure of a display panel according to an embodiment of the present invention, and FIG. 14 is a section view taken along direction E-E' in FIG. 13. In this embodiment, the light emission device layer 20 includes a first light-emitting structure 20001 and a second light-emitting structure 20002 adjacent to each other and having the same color. The first light-emitting structure 20001 and the second light-emitting structure 20002 are arranged in a mirror symmetry manner. It is to be understood that in this embodiment, a mirror symmetry manner arrangement means that the first electrode 201 and the second electrode 202 of the light-emitting structure are arranged in a mirror symmetry manner, but does not mean that the colors of the light-emitting structure are arranged in a mirror symmetry manner.

Optionally, in the direction X parallel to the plane where the substrate 10 is located, a first electrode 201 of the first light-emitting structure 20001 is located on the side of a second electrode 202 of the first light-emitting structure 20001 facing away from the second light-emitting structure 20002, and a first electrode 201 of the second light-emitting structure 20002 is located on the side of a second electrode 202 of the second light-emitting structure 20002 facing away from the first light-emitting structure 20001.

Figure 15:
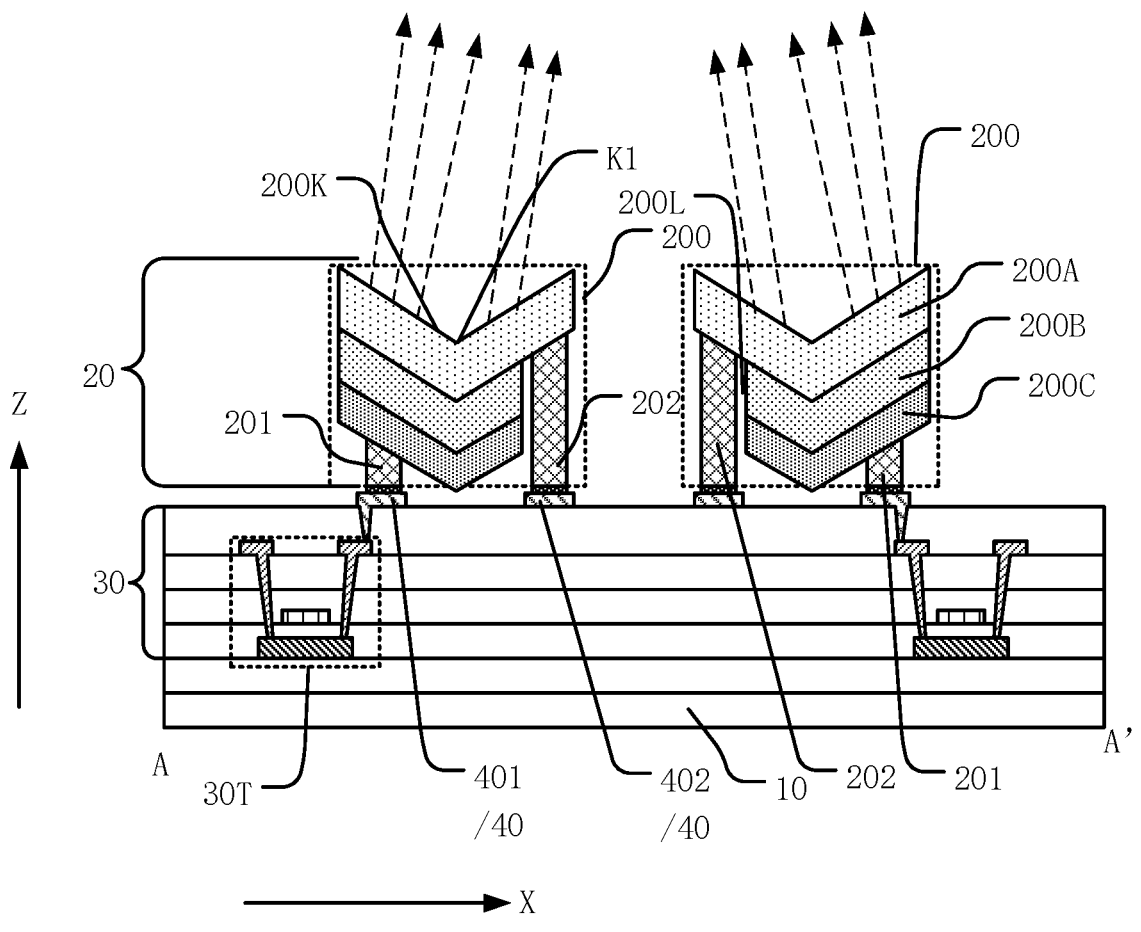
FIG. 15 is another section view taken along direction A-A' in FIG. 1.

This embodiment illustrates that the light emission device layer 20 may include multiple light-emitting structures 200 of different colors. The multiple light-emitting structures 200 of different colors at least include a first light-emitting structure 20001 and a second light-emitting structure 20002 adjacent to each other and having the same color (it is to be understood that in FIG. 13, different filling patterns represent different colors, and the same filling pattern represents the same color). The first light-emitting structure 20001 and the second light-emitting structure 20002 of the same color may be red light-emitting structures. Alternatively, the first light-emitting structure 20001 and the second light-emitting structure 20002 may be green light-emitting structures. Alternatively, the first light-emitting structure 20001 and the second light-emitting structure 20002 of the same color may be blue light-emitting structures. This is not limited in this embodiment. The first light-emitting structure 20001 and the second light-emitting structure 20002 of the same color are disposed adjacent to each other, that is, there is no other light-emitting structure having the same color between the first light-emitting structure 20001 and the second light-emitting structure 20002. In this embodiment, the first light-emitting structure 20001 and the second light-emitting structure 20002 adjacent to each other and having the same color are arranged in a mirror symmetry manner, that is, in the direction X parallel to the plane where the substrate 10 is located, the first electrode 201 of the first light-emitting structure 20001 is located on the side of the second electrode 202 of the first light-emitting structure 20001 facing away from the second light-emitting structure 20002, and the first electrode 201 of the second light-emitting structure 20002 is located on the side of the second electrode 202 of the second light-emitting structure 20002 facing away from the first light-emitting structure 20001. If the direction of the first electrode 201 of the first light-emitting structure 20001 pointing to the second electrode 202 of the first light-emitting structure 20001 is defined as a first direction, and the direction of the second electrode 201 of the second light-emitting structure 20002 pointing to the second electrode 202 of the second light-emitting structure 20002 is defined as a second direction, the first direction and the second direction are parallel to the plane where the substrate 10 is located. However, the first direction and the second direction are two opposite directions, so that the second electrode 202 of the first light-emitting structure 20001 and the second electrode 202 of the second light-emitting structure 20002 can be adjacent to each other, where the first light-emitting structure 20001 and the second light-emitting structure 20002 are adjacent to each other and have the same color. Since the side of the light-emitting structure 200 facing the substrate 10 is provided with a hollow portion 200L for the second electrode 202 electrically connecting to the n-type semiconductor layer 200A, so that the quantum well layer 200B is outside the range where the second electrode 202 is located, that is, the actual light-emitting region of the light-emitting structure 200 is outside the range where the second electrode 202 is located, the second electrode 202 of the first light-emitting structure 20001 and the second electrode 202 of the second light-emitting structure 20002 are adjacent to each other, where the first light-emitting structure 20001 and the second light-emitting structure 20002 are adjacent to each other and have the same color. In this manner, the emitted light of a first surface 200A1 of the first light-emitting structure 20001 and the emitted light of a first surface 200A1 of the second light-emitting structure 20002 may be jointly emitted to the region where the second electrode 202 of the first light-emitting structure 20001 and the second electrode 202 of the second light-emitting structure 20002 are adjacent to each other to compensate for the light in the region where the second electrode 202 of the first light-emitting structure 20001 and the second electrode 202 of the second light-emitting structure 20002 are adjacent to each other (as shown in FIG. 15, the light intensity is indicated by a dotted line with an arrow, the greater the number of dotted lines with arrows is, the greater the light-emitting area on the surface is, and the greater the intensity of the emitted light is, and the smaller the number of dotted lines with arrows is, the smaller the light-emitting area on the surface is, and the smaller the intensity of the emitted light is). Thus, the amount of light emitted by the light-emitting structure 200 of the same color under different viewing angles is ensured, and the problem of color cast is avoided, thereby effectively improving the overall display uniformity of the display panel 000.

In some optional embodiments, referring to FIGS. 1 and 15, FIG. 15 is another section view taken along direction A-A' in FIG. 1. In this embodiment, the light emission device layer 20 includes two adjacent light-emitting structures 200 arranged in a mirror symmetry manner. Optionally, a second electrode 202 of one light-emitting structure 200 is disposed adjacent to a second electrode 202 of another light-emitting structure 200. It is to be understood that in this embodiment, a mirror symmetry manner arrangement means that the first electrode 201 and the second electrode 202 of the light-emitting structure are arranged in a mirror symmetry manner, but does not mean that the colors of the light-emitting structure are arranged in a mirror symmetry manner.

This embodiment illustrates that multiple light-emitting structures 200 disposed in the light emission device layer 20 include two adjacent light-emitting structures 200. The two adjacent light-emitting structures 200 refer to the fact that there is no other light-emitting structure 200 between the two light-emitting structures 200. In this embodiment, two adjacent light-emitting structures 200 are arranged in a mirror symmetry manner, where among the two adjacent light-emitting structures 200, a second electrode 202 of one light-emitting structure 200 and a second electrode 202 of the other light-emitting structure 200 are disposed adjacent to each other. There is no other electrode structure between the second electrode 202 of the one light-emitting structure 200 and the second electrode 202 of the other light-emitting structure 200. Since the quantum well layer 200B of the light-emitting structure 200 is in a region other than a second electrode 202, the actual light-emitting region of the light-emitting structure 200 is outside the range where the second electrode 202 is located, that is, the light-emitting area of the region corresponding to the second surface 200A2 where the second electrode 202 is located is small, and the light-emitting area of the region corresponding to the first surface 200A1 where the first electrode 201 is located is great. In this embodiment, two adjacent light-emitting structures 200 are designed in a mirror manner, and the second electrodes 202 of the two adjacent light-emitting structures 200 are adjacent to each other, so that light emitted from the respective first surfaces 200A1 of the two adjacent light-emitting structures 200 may converge toward the middle region where the two second electrodes 202 are adjacent to each other, thereby compensating for the light between the two adjacent light-emitting structures 200 (as shown in FIG. 15, the light intensity is indicated by a dotted line with an arrow, the greater the number of dotted lines with arrows is, the greater the light-emitting area on the surface is, and the greater the intensity of the emitted light is, and the smaller the number of dotted lines with arrows is, the smaller the light-emitting area on the surface is, and the smaller the intensity of the emitted light is). Thus, the overall display uniformity of the display panel 000 is effectively improved.

Figure 16:
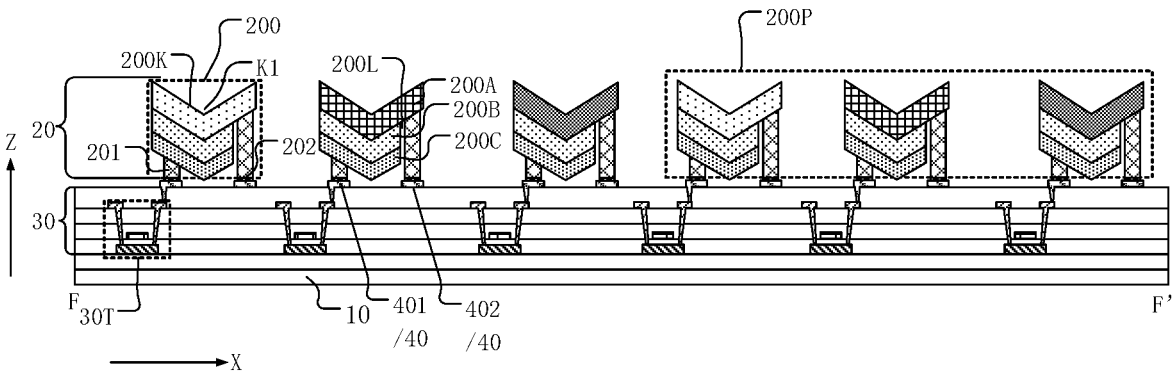
FIG. 16 is a section view taken along direction F-F' in FIG. 13.

In some optional embodiments, referring to FIGS. 13 and 16, FIG. 16 is a section view taken along direction F-F' in FIG. 13. In this embodiment, the multiple light-emitting structures 200 of the light emission device layer 20 include multiple repeating units 200P. A repeating unit 200P at least includes three light-emitting structures 200 of different colors. Optionally, a repeating unit 200P may include a red light-emitting structure, a green light-emitting structure, and a blue light-emitting structure.

The display panel 000 at least includes a first edge 000K. In the light-emitting structures 200 included in the same repeating unit 200P, a first electrode 201 is located on the side of a second electrode 202 adjacent to the first edge 000K.

This embodiment illustrates that among the multiple light-emitting structures 200 disposed in the light emission device layer 20, three light-emitting structures 200 of different colors may be used as one repeating unit 200P. It is to be understood that the three light-emitting structures 200 of different colors may be a red light-emitting structure, a green light-emitting structure, and a blue light-emitting structure respectively, that is, one repeating unit 200P may at least include three light-emitting structures of different colors, namely, a red light-emitting structure, a green light-emitting structure, and a blue light-emitting structure. When the display panel 000 is manufactured, it is possible to commonly transfer the repeating unit 200P as a group from the growth substrate to the substrate structure of the display panel 000. In this embodiment, in at least three light-emitting structures 200 included in the same repeating unit 200P, a first electrode 201 of each light-emitting structure 200 is configured to be located at the side of a second electrode 202 of each light-emitting structure 200 adjacent to the first edge 000K, that is, in the same repeating unit 200P, the relative positional relationship between a first electrode 201 and a second electrode 202 of each light-emitting structure 200 is the same. With reference to the first edge 000K of the display panel 000, in the same repeating unit 200P, three first electrodes 201 and three second electrodes 202 of the three light-emitting structures 200 are arranged in such a manner that a first electrode 201, a second electrode 202, a first electrode 201, a second electrode 202, a first electrode 201, and a second electrode 202 are arranged in the same direction in sequence, so that first electrodes 201 and second electrodes 202 of several light-emitting structures 200 in at least one repeating unit 200P are arranged in the same manner. During the manufacturing process of the display panel 000, when multiple light-emitting structures 200 are massively transferred from the growth substrate, several light-emitting structures 200 of one repeating unit 200P may be transferred together (for example, one repeating unit 200P is adsorbed together by a transfer stamp) to a display substrate. Moreover, the arrangement directions of the light-emitting structures 200 included in one repeating unit 200P are consistent, so that it is beneficial to improve the transfer efficiency, and the transfer is facilitated, thereby improving the process efficiency.

It is to be understood that in some other optional embodiments, first electrodes 201 and second electrodes 202 of several light-emitting structures 200 in the same repeating unit 200P are arranged in the same manner, and first electrodes 201 and second electrodes 202 of light-emitting structures 200 included in different repeating units 200P are arranged in different manners.

Figure 17:
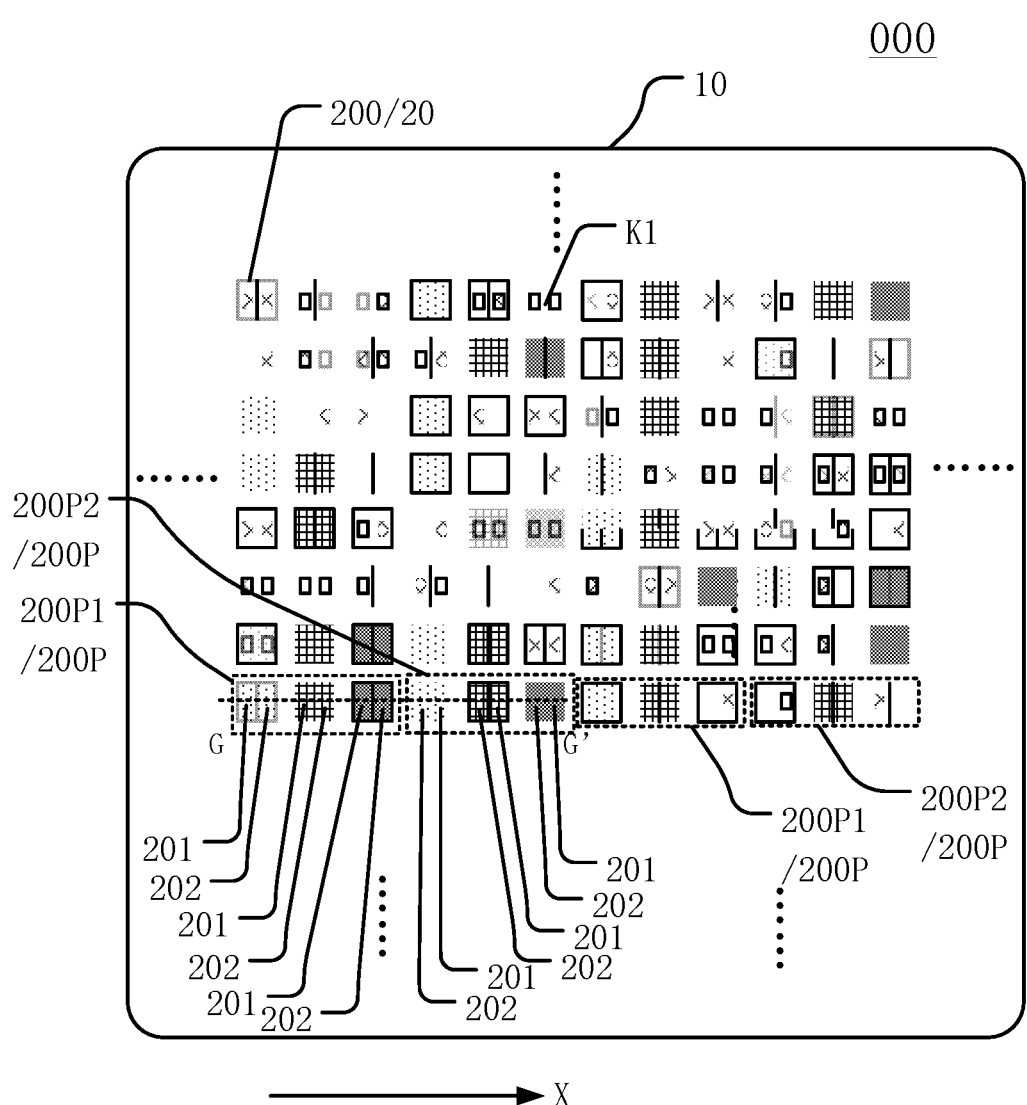
FIG. 17 is a diagram illustrating another planar structure of a display panel according to an embodiment of the present invention.
Figure 18:
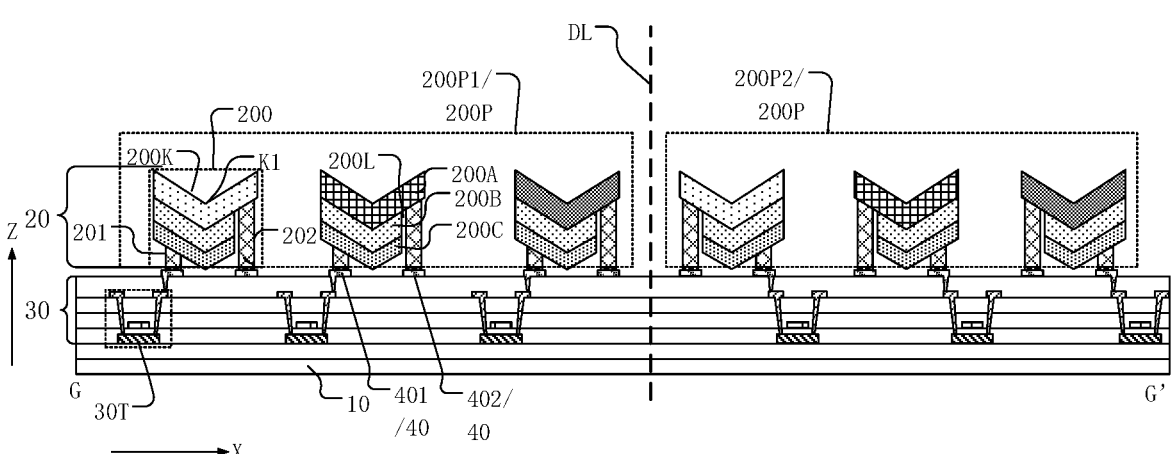
FIG. 18 is a section view taken along direction G-G' in FIG. 17.

As shown in FIGS. 17 and 18, FIG. 17 is a diagram illustrating another planar structure of a display panel according to an embodiment of the present invention (it is to be understood that to clearly illustrate the structure of this embodiment, transparency filling is performed on FIG. 17). FIG. 18 is a section view taken along direction G-G' in FIG. 17. In this embodiment, multiple repeating units 200P include a first repeating unit 200P1 and a second repeating unit 200P2. In a first symmetry axis DL (it is to be understood that the first symmetry axis DL is a virtual structure, and the first symmetry axis DL is merely an illustration of the arrangement relationship between the first repeating unit 200P1 and the second repeating unit 200P2, and does not indicate a structure actually present in the display panel 000), the first repeating unit 200P1 and the second repeating unit 200P2 form a mirror symmetry structure. It is to be understood that in this embodiment, the mirror symmetry structure means that the first electrodes 201 and the second electrodes 202 of the light-emitting structures are arranged in a mirror symmetry manner, but does not mean that the colors of the light-emitting structures are arranged in a mirror symmetry manner. This embodiment illustrates that among the multiple repeating units 200P included in the light emission device layer 20, not all repeating units 200P are arranged in the same manner. The multiple repeating units 200P may include a first repeating unit 200P1 and a second repeating unit 200P2. The first repeating unit 200P1 and the second repeating unit 200P2 form a mirror symmetry structure along a virtual first symmetry axis DL between the first repeating unit 200P1 and the second repeating unit 200P2. Specifically, three first electrodes 201 and three second electrodes 202 of the three light-emitting structures 200 included in the first repeating unit 200P1 are arranged in such a manner that a first electrode 201, a second electrode 202, a first electrode 201, a second electrode 202, a first electrode 201, and a second electrode 202 may be arranged in the same direction (the direction is perpendicular to the first symmetry axis DL, for example, the direction X parallel to the plane where the substrate 10 is located in the figure) in sequence. Three first electrodes 201 and three second electrodes 202 of the three light-emitting structures 200 included in the second repeating unit 200P2 are arranged in such a manner that a second electrode 202, a first electrode 201, a second electrode 202, a first electrode 201, a second electrode 202, and a first electrode 201 may be arranged in the same direction (the direction is perpendicular to the first symmetry axis DL, for example, the direction X parallel to the plane where the substrate 10 is located in the figure) in sequence (as shown in FIGS. 17 and 18). Alternatively, three first electrodes 201 and three second electrodes 202 of the three light-emitting structures 200 included in the first repeating unit 200P1 are arranged in such a manner that a second electrode 202, a first electrode 201, a second electrode 202, a first electrode 201, a second electrode 202, and a first electrode 201 may be arranged in the same direction (the direction is perpendicular to the first symmetry axis DL, for example, the direction X parallel to the plane where the substrate 10 is located in the figure) in sequence. Three first electrodes 201 and three second electrodes 202 of the three light-emitting structures 200 included in the second repeating unit 200P2 are arranged in such a manner that a first electrode 201, a second electrode 202, a first electrode 201, a second electrode 202, a first electrode 201, and a second electrode 202 may be arranged in the same direction (the direction is perpendicular to the first symmetry axis DL, for example, the direction X parallel to the plane where the substrate 10 is located in the figure) in sequence (not shown in the drawings). Thus, first electrodes 201 and second electrodes 202 of several light-emitting structures 200 in the first repeating unit 200P1 are arranged in the same manner, and first electrodes 201 and second electrodes 202 of several light-emitting structures 200 in the second repeating unit 200P2 are arranged in the same manner. During the manufacturing process of the display panel 000, when multiple light-emitting structures 200 are massively transferred from the growth substrate, several light-emitting structures 200 of multiple or all of the first repeating units 200P1 may be transferred together (for example, one first repeating unit 200P1 is adsorbed together by a transfer stamp) to the display substrate, and several light-emitting structures 200 of multiple or all of the second repeating units 200P2 may be transferred together (for example, one second repeating unit 200P2 is adsorbed together by a transfer stamp) to the display substrate. Thus, it is beneficial to improve the transfer efficiency, and the transfer is facilitated. In this manner, the process efficiency is improved, and at the same time, two repeating units in mirror symmetry may implement light compensation. For example, light intensity compensation is performed at the position (around the first symmetry axis DL) where the second electrodes of the two repeating units in mirror symmetry are adjacent to each other, so that the overall display uniformity of the display panel 000 may be effectively improved.

Figure 19:
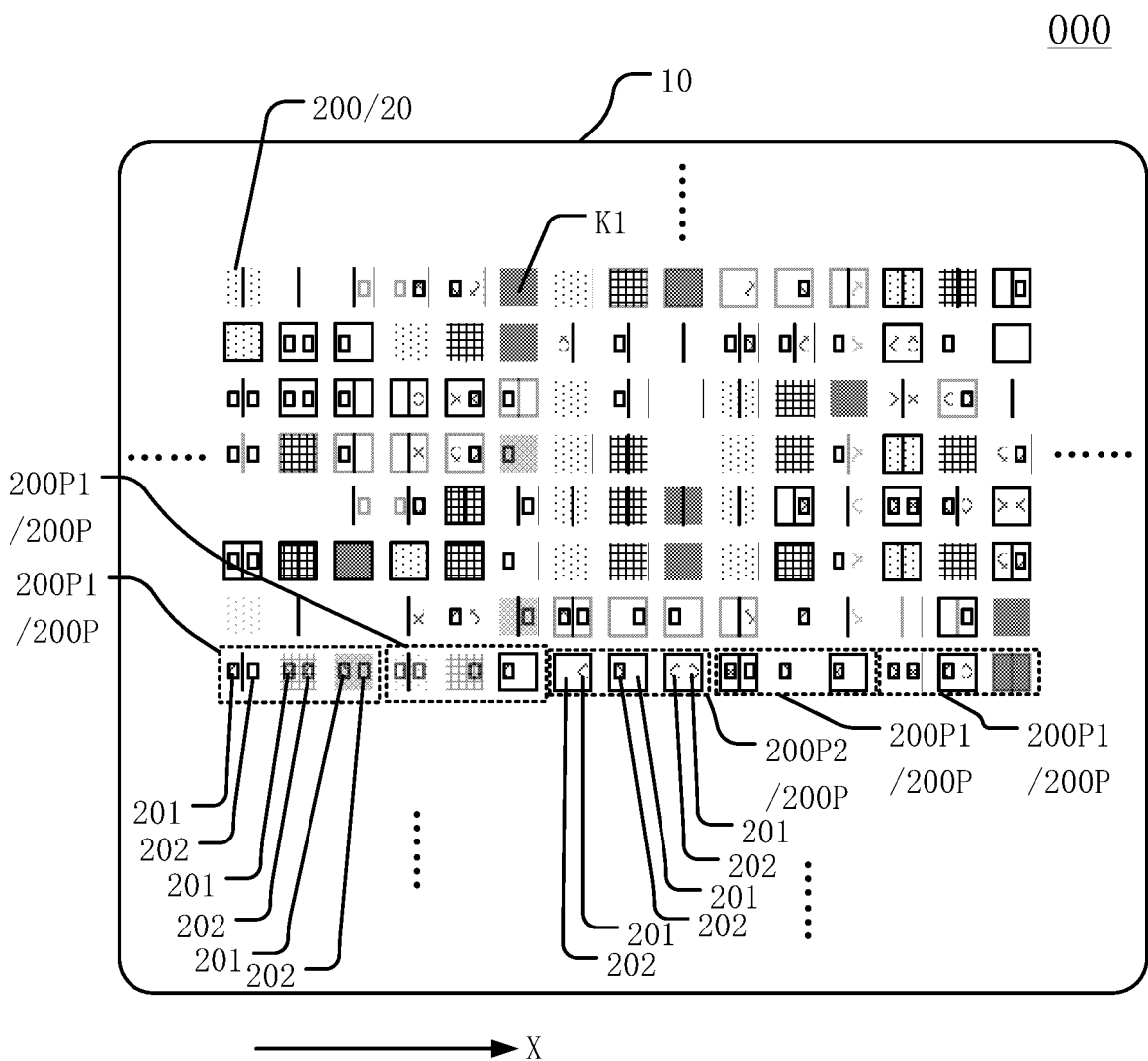
FIG. 19 is a diagram illustrating another planar structure of a display panel according to an embodiment of the present invention.

Optionally, as shown in FIGS. 17, 18, and 19, FIG. 19 is a diagram illustrating another planar structure of a display panel according to an embodiment of the present invention (it is to be understood that to clearly illustrate the structure of this embodiment, transparency filling is performed on FIG. 19). In this embodiment, at least one second repeating unit 200P2 is provided between two adjacent first repeating units 200P1, and at least one first repeating unit 200P1 is provided between two adjacent second repeating units 200P2.

This embodiment illustrates that in the direction X parallel to the plane where the substrate 10 is located, two repeating units in mirror symmetry may be two adjacent repeating units. As shown in FIGS. 17 and 18, one second repeating unit 200P2 is provided between two adjacent first repeating units 200P1, and one first repeating unit 200P1 is provided between two adjacent second repeating units 200P2. Alternatively, in the direction X parallel to the plane where the substrate 10 is located, two repeating units in mirror symmetry may not be two adjacent repeating units. As shown in FIG. 19, one second repeating unit 200P2 is provided between two adjacent first repeating units 200P1, and at least two first repeating units 200P1 are provided between two adjacent second repeating units 200P2. That is, in the direction X parallel to the plane where the substrate 10 is located, multiple repeating units 200P may be a first repeating unit 200P1, a first repeating unit 200P1, a second repeating unit 200P2, a first repeating unit 200P1, a first repeating unit 200P1, and a second repeating unit 200P2 . . . , which are cyclically arranged. Alternatively, two second repeating units 200P2 are provided between two adjacent first repeating units 200P1, and at least one first repeating unit 200P1 is provided between two adjacent second repeating units 200P2 (not shown in the drawings). Alternatively, two second repeating units 200P2 are provided between two adjacent first repeating units 200P1, and at least two first repeating units 200P1 are provided between two adjacent second repeating units 200P2 (not shown in the drawings). Alternatively, there may be other arrangements. It is only required that in the direction X parallel to the plane where the substrate 10 is located, at least one second repeating unit 200P2 is provided between two adjacent first repeating units 200P1, and at least one first repeating unit 200P1 is provided between two adjacent second repeating units 200P2. In this embodiment, multiple repeating units 200 in the light emission device layer 20 satisfy the fact that the multiple repeating units 200 at least include a first repeating unit 200P1 and a second repeating unit 200P2 that form a mirror symmetry structure. Thus, batch transfer is facilitated, and at the same time, the arrangement of repeating units 200P is diversified, thereby improving flexibility in transfer.

Figure 20:
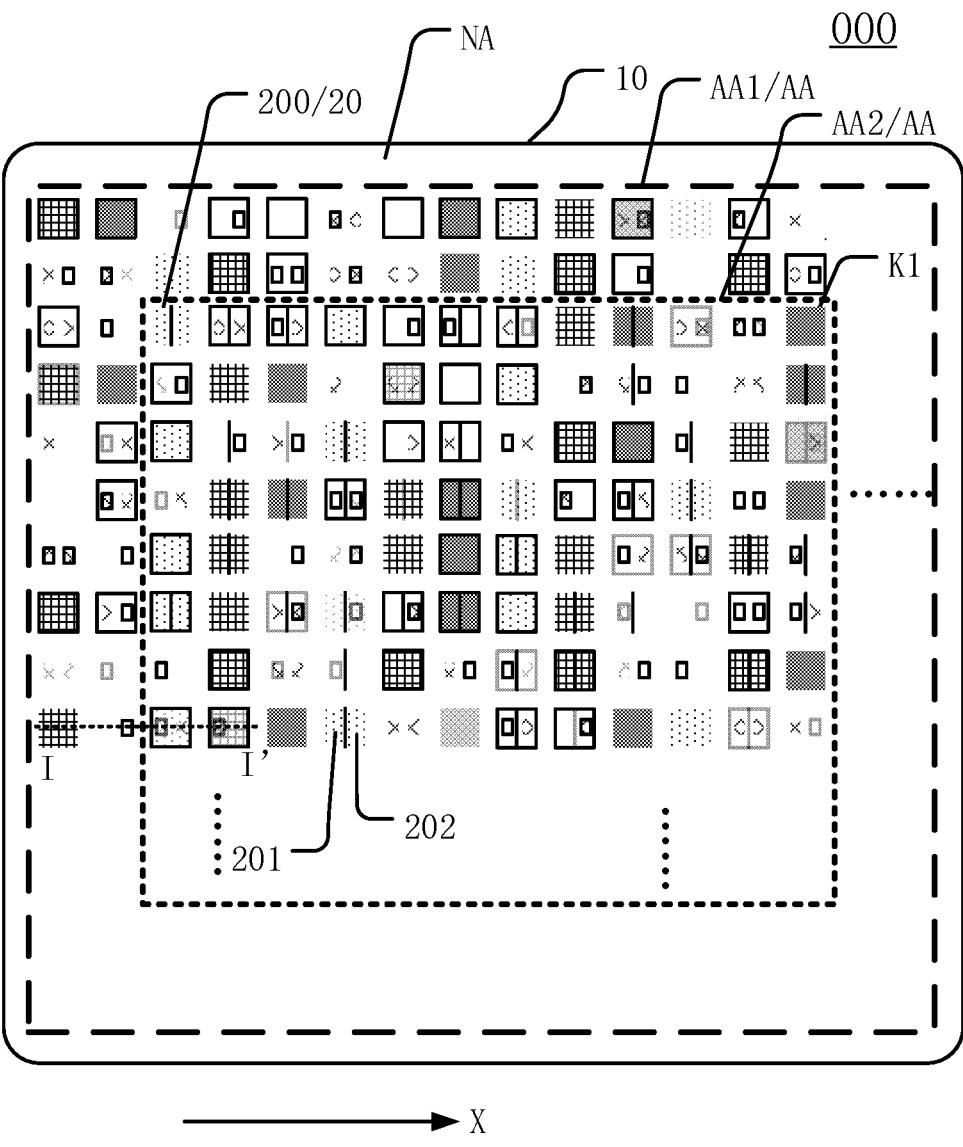
FIG. 20 is a diagram illustrating another planar structure of a display panel according to an embodiment of the present invention.
Figure 21:
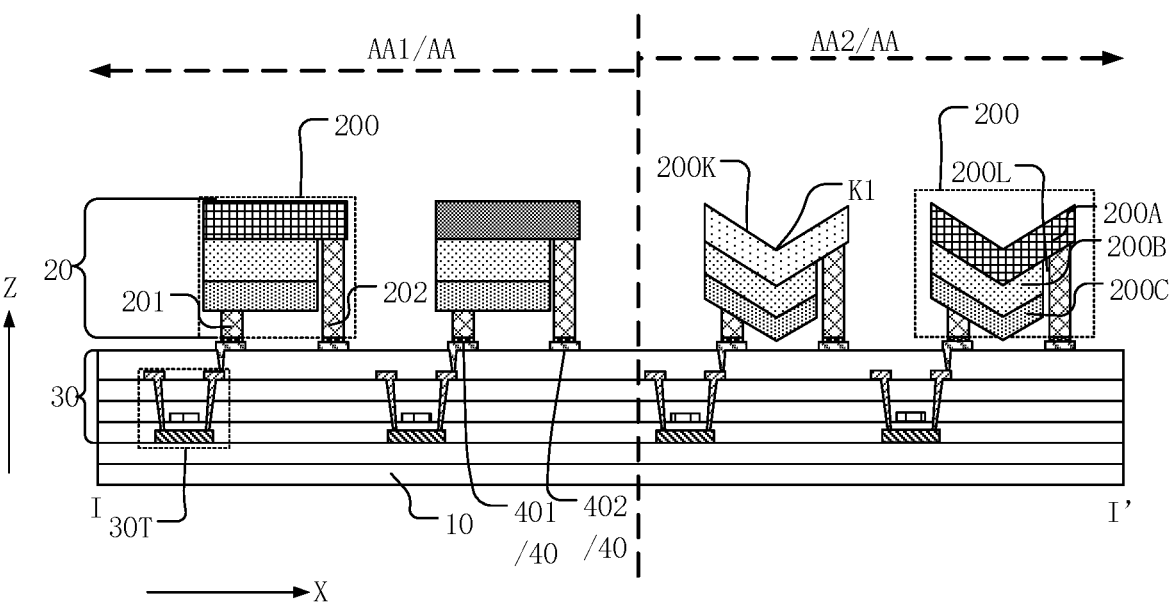
FIG. 21 is a section view taken along direction I-I' in FIG. 20.

In some optional embodiments, referring to FIGS. 20 and 21, FIG. 20 is a diagram illustrating another planar structure of a display panel according to an embodiment of the present invention, and FIG. 21 is a section view taken along direction I-I' in FIG. 20 (it is to be understood that to clearly illustrate the structure of this embodiment, transparency filling is performed on FIG. 20). In this embodiment, the display panel 000 includes a display region AA and a non-display region NA at least partially surrounding the display region AA. The display region AA includes a first display region AA1 and a second display region AA2. The first display region AA1 is arranged adjacent to the non-display region NA. The second display region AA2 is located on the side of the first display region AA1 far away from the non-display region NA.

In the second display region AA2, the surface on the side of a light-emitting structure 200 facing away from the substrate 10 includes a recess portion 200K.

In the first display region AA1, the surface on the side of a light-emitting structure 200 facing away from the substrate 10 is a planar structure.

This embodiment illustrates that the display region AA of the display panel 000 includes an edge display region and a non-edge display region, such as the first display region AA1 and the second display region AA2 shown in FIG. 20. The first display region AA1 is arranged adjacent to the non-display region NA. The first display region AA1 may be understood as the edge display region. The second display region AA2 is located on the side of the first display region AA1 facing away from the non-display region NA. The second display region AA2 may be understood as the non-edge display region. In this embodiment, the surface on the side, facing away from the substrate 10, of the light-emitting structure 200 in the edge display region, that is, the first display region AA1, adjacent to the non-display region NA is a planar structure. In the remaining second display region AA2, the surface on the side of a light-emitting structure 200 facing away from the substrate 10 includes a recess portion 200K, so that the light-emitting structure 200 in the first display region AA1 adjacent to the edge of the display panel 000 is still a structure in which the light-emitting surface in the related art is flat, and only the light-emitting surface of the light-emitting structure 200 in the second display region AA2 is configured to be the structure of a recess portion 200K. In this manner, the problem that after the light-emitting structure 200 in the edge display region is provided with a recess portion 200K, the light emitted from the light-emitting structure 200 in the second display region AA2 to the edge side of the display panel 000 cannot be compensated, and a color cast difference is prone to occur is avoided. Thus, it is beneficial to alleviate the color cast difference in the range of the edge display region of the display panel 000, thereby improving the overall display quality.

Figure 22:
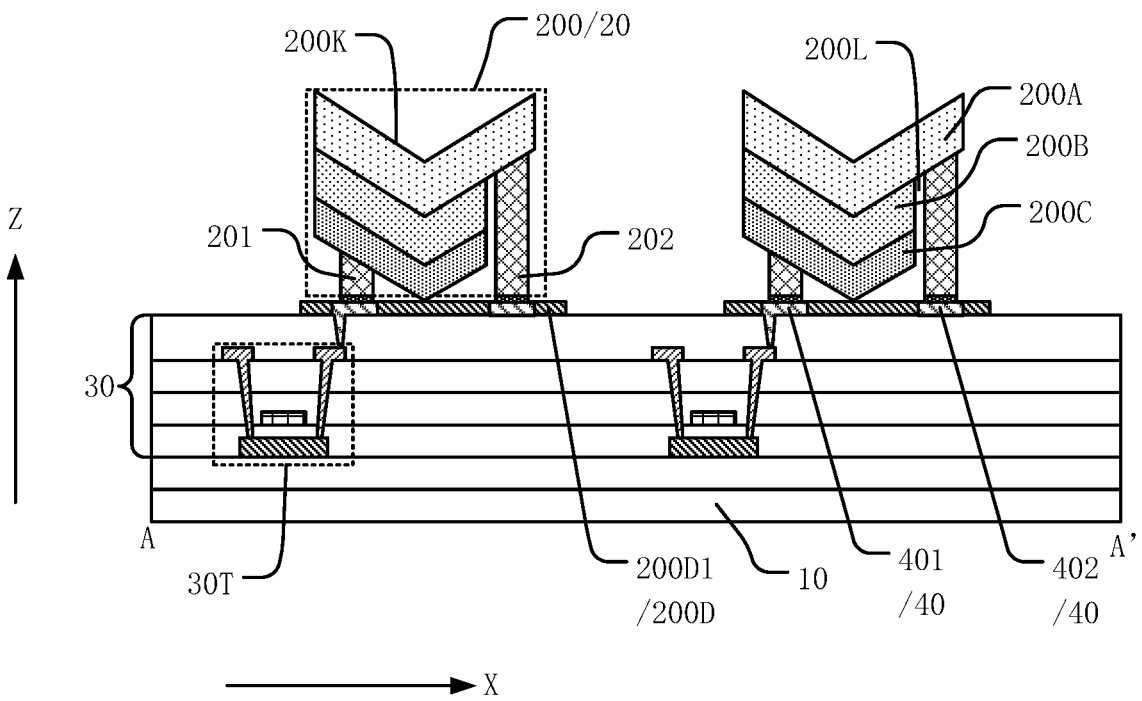
FIG. 22 is another section view taken along direction A-A' in FIG. 1.
Figure 23:
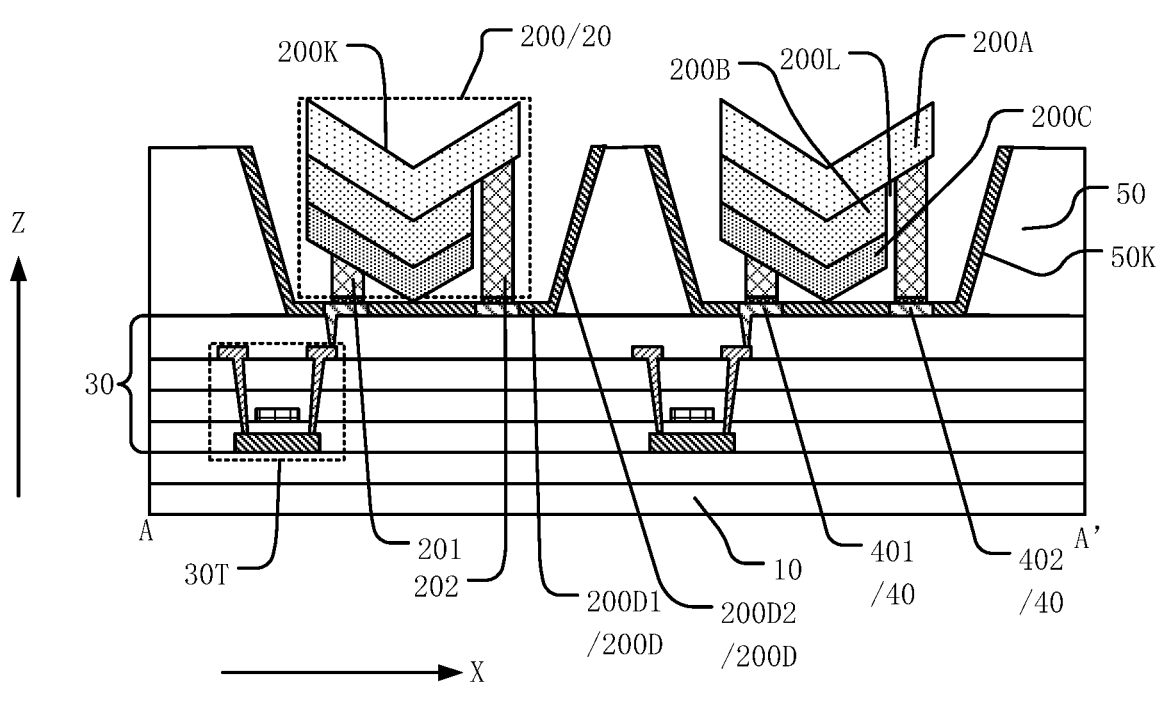
FIG. 23 is another section view taken along direction A-A' in FIG. 1.

In some optional embodiments, referring to FIGS. 1, 22, and 23, FIG. 22 is another section view taken along direction A-A' in FIG. 1, and FIG. 23 is another section view taken along direction A-A' in FIG. 1. In this embodiment, the light-emitting structure 200 also includes a reflective layer 200D. In the direction Z perpendicular to the plane where the substrate 10 is located, at least part of the reflective layer 200D is located on the side of the light-emitting structure 200 facing the substrate 10.

This embodiment illustrates that the light-emitting structure 200 also includes a reflective layer 200D. The reflective layer 20D may be disposed on the side of the light emission device layer 20 facing the driver circuit layer 30 and may include multiple first reflective portions 200D1. The first reflective portions 200D1 correspond to the light-emitting structure 200 and may be disposed on the side of the p-type semiconductor layer 200C of the light-emitting structure 200 facing the substrate 10. The first reflective portions 200D1 need to be formed with through holes to expose the first bonding electrode 401 and the second bonding electrode 402 of the bonding electrode layer 40, so that when the light-emitting structure 200 is transferred, the first electrode 201 can be bound and electrically connected to the first bonding electrode 401, and the second electrode 202 can be bound and electrically connected to the second bonding electrode 402. In this embodiment, the first reflecting portions 200D1 disposed on the side of the light-emitting structure 200 facing the substrate 10 may further reflect the light emitted from the light-emitting structure 200 to the side of the substrate 10 back to the side of the light-emitting surface of the display panel 000, that is, back to the side of the light-emitting structure 200 facing away from the substrate 10. In this manner, it is beneficial to further improve the light-emitting efficiency, thereby improving the light type of the light-emitting structure 200.

Optionally, as shown in FIGS. 1 and 23, the reflective layer 200D may also include a second reflective portion 200D2 that is located on the side of the light-emitting structure 200. The second reflective portion 200D2 may be disposed around the light-emitting structure 200. For example, the side of the driver circuit layer 30 facing away from the substrate 10 may include a pixel defining layer 50. The pixel defining layer 50 includes multiple openings 50K. The openings 50K define regions of the first bonding electrode 401 and the second bonding electrode 402 of the bonding electrode layer 40, so that the subsequent light-emitting structure 200 is bound and electrically connected to bonding electrodes in the opening 50K. The second reflective portion 200D2 may be located on the sidewall of opening 50K to form a structure disposed around the light-emitting structure 200. The second reflection portion 200D2 may avoid light leakage on the side of the light-emitting structure 200 and may further reflect the light emitted from the side of the light-emitting structure 200, thereby further improving the light-emitting efficiency.

In this embodiment, the material of the reflective layer 200D may be a metal material having high reflectance such as aluminum metal and silver metal. Alternatively, the reflective layer 200D may also be a combination of two or more metal materials such as a high reflective and opaque metal material. Alternatively, the reflective layer 200D may also be a distributed Bragg reflection structure. The distributed Bragg reflection structure may be formed by alternately stacking film materials such as silicon dioxide/titanium dioxide ($SiO_2/TiO_2$) or silicon dioxide/niobium pentoxide ($SiO_2/NbO_5$) or may also be made of materials such as magnesium fluoride, zinc sulfide, silicon nitride, and amorphous silicon. The reflective layer of the distributed Bragg reflection structure is formed by stacking materials having different refractive indexes. The position of an energy gap is adjusted by changing the refractive index or the thickness of a film, and the light emitted from the light-emitting structure 200 is selectively filtered out and then reflected. Thus, the impact of light absorption on reflected light can be reduced, and more light is reflected by the reflective layer 200D, so that the purpose of emitting more light to the side of the light-emitting surface of the display panel 000 is implemented. In this manner, it is beneficial to improve the light-emitting efficiency, and the light type is improved, thereby improving the display brightness and display quality of the display panel 000 during display.

Figure 24:
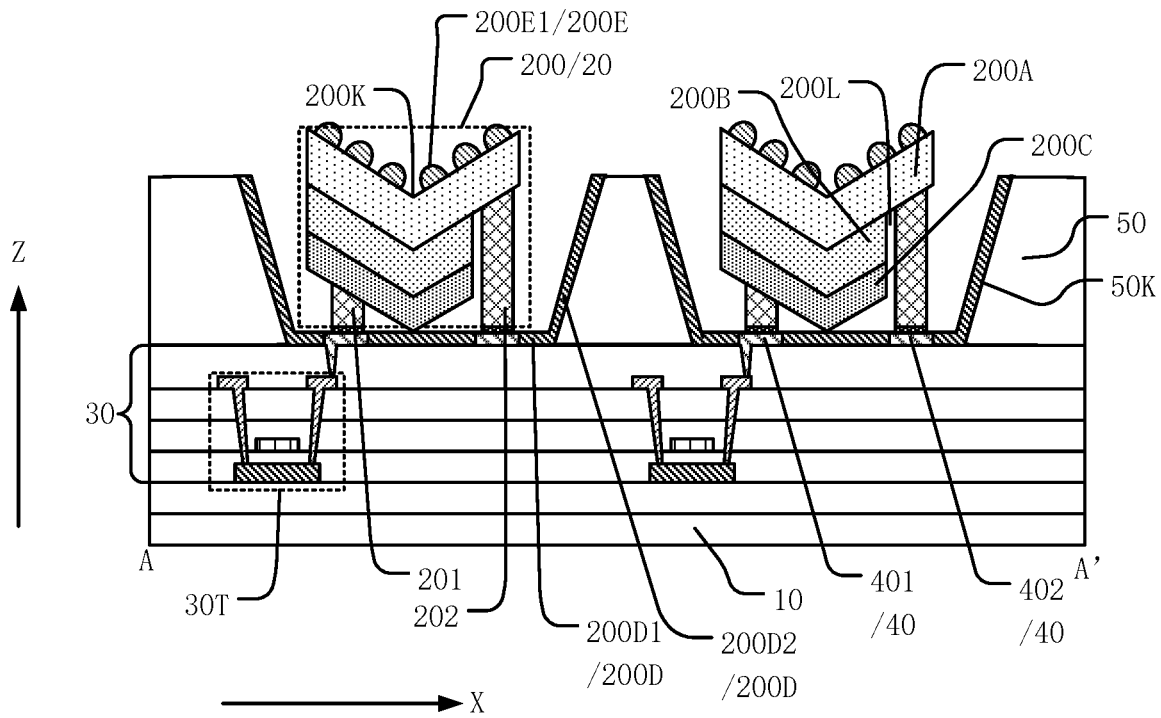
FIG. 24 is another section view taken along direction A-A' in FIG. 1.
Figure 25:
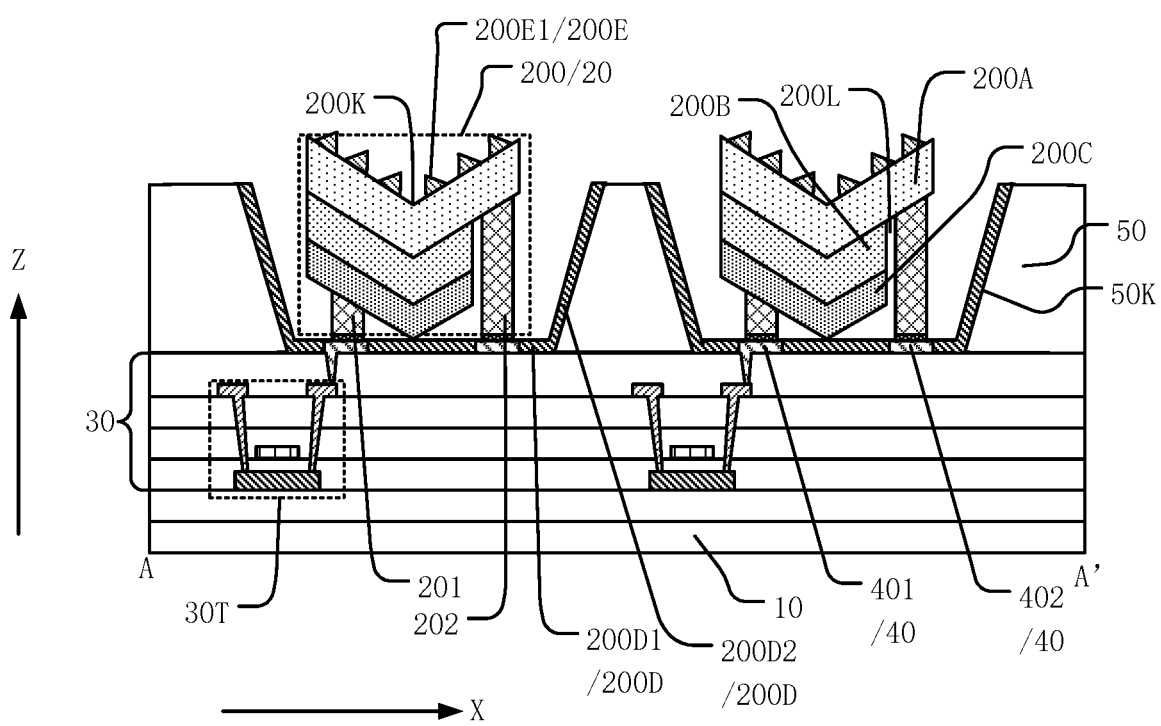
FIG. 25 is another section view taken along direction A-A' in FIG. 1.

In some optional embodiments, referring to FIGS. 1, 24, and 25, FIG. 24 is another section view taken along direction A-A' in FIG. 1, and FIG. 25 is another section view taken along direction A-A' in FIG. 1. In this embodiment, the light-emitting surface of the light-emitting structure 200 includes a lens structure 200E.

This embodiment illustrates that the light-emitting surface of the light-emitting structure 200 (which can be understood as the side of the light-emitting structure 200 facing away from the substrate 10) includes a lens structure 200E. The lens structure 200E may play the role in light gathering. The lens structure 200E may gather the light emitted from the light-emitting surface of the light-emitting structure 200 in the direction X parallel to the plane where the substrate 10 is located to reduce the light-emitting angle of the light-emitting structure 200.

Optionally, the lens structure 200E may include multiple lens units 200E1 arranged in a periodic manner. Each lens unit 200E1 may be in the shape of a wavy column (as shown in FIG. 24), a triangular prism (as shown in FIG. 25), and a trapezoidal column. There is a gap between every two lens units 200E1, so that the angle of the light emitted by the light emitting structure 200 can be restricted, and at the same time, the brightness of the light emitting structure 200 can be improved.

Optionally, the lens structure 200E may be manufactured by transfer printing process or coating process. The material of the lens structure 200E may be an ultraviolet-curable adhesive. This is not limited in this embodiment. It is only required that the lens structure 200E can gather the light emitted from the light-emitting surface of the light-emitting structure 200 in the direction X parallel to the plane where the substrate 10 is located, thereby improving the brightness.

Figure 26:
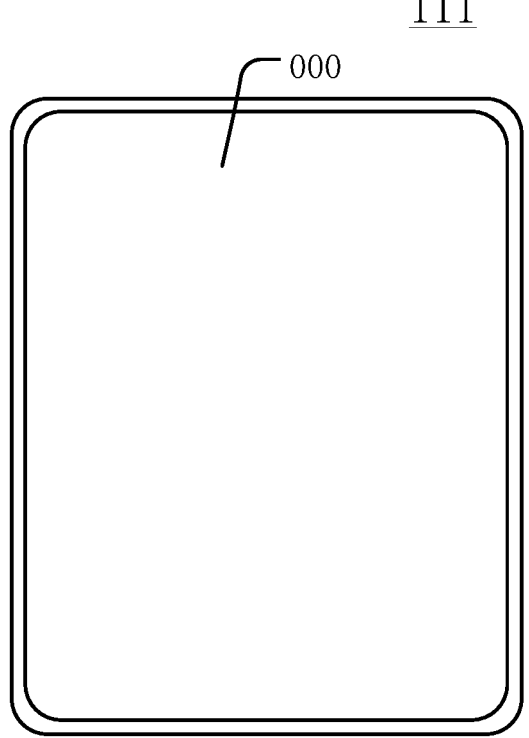
FIG. 26 is a diagram illustrating the planar structure of a display device according to an embodiment of the present invention.

In some optional embodiments, referring to FIG. 26, FIG. 26 is a diagram illustrating the planar structure of a display device according to an embodiment of the present invention. The display device 111 provided in this embodiment includes the display panel 000 according to the preceding embodiments of the present invention. In the embodiment of FIG. 26, the display device 111 is described by using only a mobile phone as an example. It is to be understood that the display device 111 provided in this embodiment of the present invention may be a computer, a television, a vehicle-mounted display device, or other display devices 111 having display functions. This is not limited in the present invention. The display device 111 provided in this embodiment of the present invention has the beneficial effect of the display panel 000 provided in the embodiments of the present invention. For details, reference may be made to the specific description of the display panel 000 in the preceding embodiments, and the details are not repeated in this embodiment.

As can be seen from the preceding embodiments, the display panel and the display device provided by the present invention at least implement the beneficial effects below.

The film structure of the display panel provided by the present invention includes a substrate and a light emission device layer located on the side of the substrate. The substrate may be used as the carrier substrate. The light emission device layer includes multiple light-emitting structures. The region in which at least one light-emitting structure is located may be understood as the pixel region in which the display panel is divided. A light-emitting structure at least includes a first electrode and a second electrode. The first electrode and the second electrode are located on the same side of the light-emitting structure facing the substrate. The light-emitting structure is a horizontal light-emitting structure. The first electrode and the second electrode are disposed on the same side of the light-emitting structure, so that when the light-emitting structure is transferred, the first electrode and the second electrode are directly bound and electrically connected to a bonding electrode on a side of the substrate. In this manner, there is no need to dispose another conductive structure and use the conductive structure as the connection structure between an electrode of the light-emitting structure and a bonding electrode on the panel. Thus, it is beneficial to reduce the manufacturing costs and process difficulty, and the panel structure is simplified. In the present invention, the surface on the side of the light-emitting structure facing away from the substrate is configured to include a recess portion, so that among at least light emitted from the surface on the side of the light-emitting structure facing away from the substrate, the light intensity at a side viewing angle is reduced, and light from a side viewing angle of each light-emitting structure is reduced. Among light emitted from the surface on the side of the light-emitting structure facing away from the substrate, more light can be emitted from a positive viewing angle range. Compared with the display panel in the related art in which the surface on the side of the light-emitting structure facing away from the substrate is a flat structure, when the display panel of the present invention is displayed, the amount of total reflected light from the side viewing angle of the light-emitting structure inside the film of the panel can be reduced, so that the brightness of the display panel in the positive viewing angle range is improved. Thus, the halo phenomenon is weakened, so that it is beneficial to alleviate the halo problem, thereby improving the display quality.

While some specific embodiments of the present invention has been described in detail through examples, it should be understood by those skilled in the art that the preceding examples are for illustration only and are not intended to limit the scope of the present invention. It should be understood by those skilled in the art that modifications may be made to the preceding embodiments without departing from the scope and spirit of the present invention. The scope of the present invention is defined by the scope of the appended claims.

What is claimed is:

1. A display panel, comprising a substrate and a light emission device layer, wherein the light emission device layer is located on a side of the substrate, and the light emission device layer comprises a plurality of light-emitting structures, a first electrode and a second electrode;

in a direction perpendicular to a plane where the substrate is located, the first electrode and the second electrode are located on a side of a light-emitting structure of the plurality of light-emitting structures facing the substrate; and a surface on a side of the light-emitting structure facing away from the substrate comprises a recess portion, and the recess portion is formed by at least part of the surface on the side of the light-emitting structure facing away from the substrate, which recesses toward a side of the light-emitting structure adjacent to the substrate.

2. The display panel according to claim 1, wherein in the direction perpendicular to the plane where the substrate is located, the light-emitting structure comprises an n-type semiconductor layer, a quantum well layer, and a p-type semiconductor layer stacked, the first electrode is connected to the p-type semiconductor layer, and the second electrode is connected to the n-type semiconductor layer; and the side of the light-emitting structure facing the substrate comprises a hollow portion extending through the quantum well layer and the p-type semiconductor layer, and the second electrode is connected to the n-type semiconductor layer in the hollow portion.

3. The display panel according to claim 1, wherein the light-emitting structure comprises a first surface and a second surface on the side facing away from the substrate, and the first surface intersects the second surface at a first position; and in the direction perpendicular to the plane where the substrate is located, a distance from the first position to the substrate is less than distances from other positions in the first surface to the substrate, and the distance from the first position to the substrate is less than distances from other positions in the second surface to the substrate.

4. The display panel according to claim 3, wherein an included angle between the first surface and the second surface is θ, and θ≥150°.

5. The display panel according to claim 3, wherein the plurality of light-emitting structures comprise a first color light-emitting structure and a second color light-emitting structure, an included angle between a first surface and a second surface of the first color light-emitting structure is θ1, and an included angle between a first surface and a second surface of the second color light-emitting structure is θ2, wherein θ1<θ2.

6. The display panel according to claim 3, wherein an included angle formed between the first surface and a first reference plane is α1, and an included angle formed between the second surface and the first reference plane is α2, wherein α1=α2; and a line where the first surface intersects the second surface is a first line, and the first reference plane passes through the first line and is perpendicular to the plane where the substrate is located.

7. The display panel according to claim 3, wherein in a direction parallel to the plane where the substrate is located, in a direction of the first electrode pointing to the second electrode, a width of an orthographic projection of the first surface on the plane where the substrate is located is d1, and a width of an orthographic projection of the second surface on the plane where the substrate is located is d2, wherein d1=d2.

8. The display panel according to claim 3, wherein in a direction parallel to the plane where the substrate is located, the first surface and the first electrode are located on a same side of the first position, and the second surface and the second electrode are located on a same side of the first position; and in a direction of the first electrode pointing to the second electrode, a width of an orthographic projection of the first surface on the plane where the substrate is located is d1, and a width of an orthographic projection of the second surface on the plane where the substrate is located is d2, wherein d1<d2.

9. The display panel according to claim 8, wherein in the direction perpendicular to the plane where the substrate is located, the light-emitting structure comprises an n-type semiconductor layer, a quantum well layer, and a p-type semiconductor layer stacked, the first electrode is connected to the p-type semiconductor layer, and the second electrode is connected to the n-type semiconductor layer;

in the direction parallel to the plane where the substrate is located, the quantum well layer comprises a third surface and a fourth surface located on opposite sides of the first position, the third surface and the first electrode are located on a same side of the first position, and the fourth surface and the second electrode are located on a same side of the first position; and in the direction of the first electrode pointing to the second electrode, the width of the orthographic projection of the first surface on the plane where the substrate is located is d1, and a width of an orthographic projection of the fourth surface on the plane where the substrate is located is d3, wherein d1=d3.

10. The display panel according to claim 3, wherein an included angle formed between the first surface and a first reference plane is α1, and an included angle formed between the second surface and the first reference plane is α2, wherein α1 is not equal to α2; and a line where the first surface intersects the second surface is a first line, and the first reference plane passes through the first line and is perpendicular to the plane where the substrate is located.

11. The display panel according to claim 10, wherein in a direction parallel to the plane where the substrate is located, the first surface and the first electrode are located on a same side of the first position, and the second surface and the second electrode are located on a same side of the first position, wherein α1<α2.

12. The display panel according to claim 11, wherein in the direction perpendicular to the plane where the substrate is located, a height of the first electrode is equal to a height of the second electrode.

13. The display panel according to claim 1, wherein the light emission device layer comprises a first light-emitting structure and a second light-emitting structure adjacent to each other and having a same color, and the first light-emitting structure and the second light-emitting structure are arranged in a mirror symmetry manner.

14. The display panel according to claim 13, wherein in a direction parallel to the plane where the substrate is located, a first electrode of the first light-emitting structure is located on a side of a second electrode of the first light-emitting structure facing away from the second light-emitting structure, and a first electrode of the second light-emitting structure is located on a side of a second electrode of the second light-emitting structure facing away from the first light-emitting structure.

15. The display panel according to claim 1, wherein the light emission device layer comprises two adjacent light-emitting structures of the plurality of light-emitting structures arranged in a mirror symmetry manner, and a second electrode of one of the two adjacent light-emitting structures is disposed adjacent to a second electrode of another of the two adjacent light-emitting structures.

16. The display panel according to claim 1, wherein the light emission device layer comprises a plurality of repeating units, and a repeating unit of the plurality of repeating units comprises at least three light-emitting structures of different colors of the plurality of light-emitting structures; and the display panel comprises at least a first edge, and in light-emitting structures of the plurality of light-emitting structures comprised in a same repeating unit of the plurality of repeating units, a first electrode is located on a side of a second electrode adjacent to the first edge.

17. The display panel according to claim 16, wherein the plurality of repeating units comprise a first repeating unit and a second repeating unit, and in a first symmetry axis, the first repeating unit and the second repeating unit form a mirror symmetry structure.

18. The display panel according to claim 17, wherein at least one second repeating unit is provided between two adjacent first repeating units, and at least one first repeating unit is provided between two adjacent second repeating units.

19. The display panel according to claim 1, wherein the display panel comprises a display region and a non-display region at least partially surrounding the display region, the display region comprises a first display region and a second display region, the first display region is arranged adjacent to the non-display region, and the second display region is located on a side of the first display region facing away from the non-display region;

in the second display region, a surface on a side of a light-emitting structure of the plurality of light-emitting structures facing away from the substrate comprises a recess portion; and in the first display region, a surface on a side of a light-emitting structure of the plurality of light-emitting structures facing away from the substrate is a planar structure.

20. A display device, comprising a display panel, wherein the display panel, comprising a substrate and a light emission device layer, wherein the light emission device layer is located on a side of the substrate, and the light emission device layer comprises a plurality of light-emitting structures;

a light-emitting structure of the plurality of light-emitting structures comprises a first electrode and a second electrode, and in a direction perpendicular to a plane where the substrate is located, the first electrode and the second electrode are located on a side of the light-emitting structure facing the substrate; and a surface on a side of the light-emitting structure facing away from the substrate comprises a recess portion, and the recess portion is formed by at least part of the surface on the side of the light-emitting structure facing away from the substrate, which recesses toward a side of the light-emitting structure adjacent to the substrate.

\* \* \* \* \*